United States Patent
Hua et al.

(10) Patent No.: US 7,358,768 B2
(45) Date of Patent: Apr. 15, 2008

(54) XOR-BASED CONDITIONAL KEEPER AND AN ARCHITECTURE IMPLEMENTING ITS APPLICATION TO MATCH LINES

(75) Inventors: Chung-Hsien Hua, Sanjhih Township, Taipei County (TW); Chi-Wei Peng, Banciao (TW); Wei Hwang, La Verne, CA (US)

(73) Assignee: National Chiao Tung University, Hsinchu (TW)

( * ) Notice: Subject to any disclaimer, the term of this patent is extended or adjusted under 35 U.S.C. 154(b) by 195 days.

(21) Appl. No.: 11/328,110

(22) Filed: Jan. 10, 2006

(65) Prior Publication Data

US 2007/0103885 A1    May 10, 2007

(30) Foreign Application Priority Data

Oct. 28, 2005    (TW) ............... 94137829 A

(51) Int. Cl.
    G06F 7/50       (2006.01)
    H03K 19/21      (2006.01)
    H03K 19/096     (2006.01)
(52) U.S. Cl. ................... 326/54; 326/98; 326/113
(58) Field of Classification Search ............ 326/52–55, 326/95, 96–98; 327/200, 202, 203; 365/49, 365/185.11, 185.25, 203
    See application file for complete search history.

(56) References Cited

U.S. PATENT DOCUMENTS 6,240,001 B1    5/2001  Ross
6,373,738 B1 *  4/2002  Towler et al. ............... 365/49
6,760,242 B1    7/2004  Park et al.

FOREIGN PATENT DOCUMENTS

JP           2002163891        6/2002

OTHER PUBLICATIONS

A. Alvandpour, R. Krishnamurthy, K. Soumyanath, & S. Borkar, "A conditional keeper technique for sub-013um wide dynamic gates", 2001 Symposium on VLSI Circuits, Digest of Technical Papers, 2001, pp. 29-30.

A. Alvandpour, R. Krishnamurthy, K. Soumyanath, & S. Borkar, "A sub-130-nm conditional keeper technique", IEEE Journal of Solid-State Circuits, vol. 37 Issue 5, May 2002, pp. 633-638.

A. Alvandpour, R. Kishnamurthy, K. Soumyanath, & S. Borkar, "A low-leakage dynamic multiported register file in 0.13 um CMOS", in International Symposium on Low Power Electronics and Design, Aug. 2001, pp. 68-71.

* cited by examiner

Primary Examiner—Charles Garber
Assistant Examiner—Jany Tran
(74) Attorney, Agent, or Firm—Rosenberg, Klein & Lee

(57) ABSTRACT

The present invention discloses an XOR-based conditional keeper and an architecture implementing its application to match lines, wherein the XOR gate in the conditional keeper receives a clock signal synchronous with CAM (Content Addressable Memory) cells and cooperates with a floating signal from the floating node to create an XOR control signal, and the XOR control signal is transmitted to a P-type transistor to create a data signal to control the XOR-based conditional keeper so that the XOR-based conditional keeper can execute an appropriate corresponding action, which can replace the conventional keepers of merely "on" and "off" modes. Further, the XOR-based conditional keeper of the present invention can apply to the dynamic CAM match line architecture so that the dynamic match line can have lower power consumption, higher noise immunity, and high processing speed. Further, the XOR-based conditional keeper of the present invention can also apply to all kinds of dynamic circuits, particularly to a high fan-in circuit.

20 Claims, 30 Drawing Sheets

XOR-BASED CONDITIONAL KEEPER AND AN ARCHITECTURE IMPLEMENTING ITS APPLICATION TO MATCH LINES

BACKGROUND OF THE INVENTION

1. Field of the Invention

The present invention relates to a conditional keeper and an architecture implementing its application to match lines, particularly to an XOR-based conditional keeper and an architecture implementing its application to match lines.

2. Description of the Related Art

The Internet is formed of networks interconnected with connection nodes, which are usually routers, and data is transmitted there inside according to a common convention, i.e. the Internet protocol. A special memory CAM (Content Addressable Memory) is used to implement rapid and massive parallel searches in the data transmission process of the Internet. During a searching process, CAM compares key words with all data to obtain the target data address, and it is usually pipelined to accelerate search. As search can be initiated at every cycle, the operation rate up to once per cycle can be achieved. Usually, searching speed closely correlates with power consumption. In fact, the power consumption of a sophisticated CAM is generally proportional to its searching speed. Therefore, for maintaining a high-speed data transmission process in the Internet, it is critical to have a circuit design of efficient power management. In conventional technologies, the keeper in the dynamic mach line architecture is used to manage power, determine operation speed and provide anti-noise function. Owing to that IP has been promoted from IPv4 to IPv6, the maximum bit field to be compared also increases from a 32-bit one to a 128-bit one, and the power consumption of the entire match-line circuit also grows. Upsizing the keeper can often enhance noise immunity; however, it also brings about the problems of operation delay and power consumption rise.

The conventional dynamic match line architecture and the keeper design are to be further analyzed below in cooperation with the drawings. The conventional match line architectures can be classified into NOR-type ones and AND-type ones, and the conventional keepers can be classified into feedback ones and weak ones.

Firstly, the conventional match-line technologies are to be introduced. Refer to FIG. 1(a) and FIG. 1(b), wherein FIG. 1(a) is a diagram schematically showing the partial match-line circuit architecture usually seen in a NOR-type CAM, and FIG. 1(b) is a diagram schematically showing the circuit of a single NOR-type CAM cell. The NOR-type match-line architecture shown in FIG. 1(a) is composed of a NOR-type CAM cell set 11, which is formed of NOR-type CAM cells 111 interconnected in series, a transistor switch 13 and an inverter 15, wherein an NOR-type CAM 112 is coupled to the source of a pull-down NMOS (Ndn) 113 to form a NOR-type CAM cell 111.

As shown in FIG. 1(b), the NOR-type CAM is formed via coupling four NMOS's 171, 172, 173, 174 and two inverters 191, 192, and then, the NOR-type CAM is coupled the gate and the source of a pull-down NMOS 175 to form a single NOR-type CAM cell.

Refer to FIG. 2(a) and FIG. 2(b), wherein FIG. 2(a) is a diagram schematically showing the AND-type match-line architecture, and FIG. 2(b) is a diagram schematically showing the circuit of a single AND-type CAM cell.

The AND-type match-line architecture shown in FIG. 2(a) is composed of an AND-type CAM cell set 20, a transistor switch 22 and an inverter 24, wherein an AND-type CAM 202 is coupled to the source of a pull-down NMOS 203 to form a AND-type CAM cell 201. Similarly, as shown in FIG. 2(b), a single AND-type CAM is also formed via coupling four NMOS's 211, 212, 213, 214 and two inverters 231, 232, but the AND-type CAM is coupled to only the gate of a pull-down NMOS 215 to form a single AND-type CAM cell.

After the description of two primary conventional match-line architectures, the conventional keeper architectures are to be introduced below. It is well known: in conventional technologies, what both the NOR-type and AND-type match lines use are general feedback keepers or general weak keepers. Refer to FIG. 3(a) and FIG. 3(b) respectively schematically showing the circuit architectures of the NOR-type match line together with a feedback keeper or a weak keeper. As shown in FIG. 3(a), the match line is formed via coupling a NOR-type CAM cell set 30, wherein NOR-type CAM cells are interconnected in series, to a transistor switch 32; a feedback keeper 34, which is formed of a PMOS, is coupled to the end of the circuit, and lastly, an inverter 36 is further coupled thereto. As shown in FIG. 3(b), the match line is formed via coupling a NOR-type CAM cell set 31, wherein NOR-type CAM cells are interconnected in series, to a transistor switch 33; a weak keeper 35, which is formed via coupling two PMOS's 351, 352, is coupled to the end of the circuit, and lastly, an inverter 37 is further coupled thereto.

In the AND-type match-line architecture, in addition to the feedback keeper and the weak keeper, a dual NMOS design, which can replace the keeper, may also be used. Refer to FIG. 4(a), FIG. 4(b) and FIG. 4(c) respectively schematically showing the circuit architectures of the NOR-type match line together with a feedback keeper, a weak keeper or a dual NMOS. As shown in FIG. 4(a), the match line is formed via coupling an AND-type CAM cell set 400, wherein AND-type CAM cells are interconnected in series, to a transistor switch 402; a feedback keeper 404, which is formed of a PMOS, is coupled to the end of the circuit, and lastly, an inverter 406 is further coupled thereto. As shown in FIG. 4(b), the match line is formed via coupling a AND-type CAM cell set 410, wherein AND-type CAM cells are interconnected in series, to a transistor switch 412; a weak keeper 41, which is formed via coupling two PMOS's 411, 412, is coupled to the end of the circuit, and lastly, an inverter 416 is further coupled thereto. As shown in FIG. 4(c), the match line is also formed via coupling a AND-type CAM cell set 420, wherein AND-type CAM cells are interconnected in series, to a transistor switch 422, but herein, a dual NMOS's 424 is coupled to the end of the circuit to replace the conventional keeper, and lastly, an inverter 426 is further coupled thereto. Nevertheless, none of the feedback keeper in FIG. 4(a), the weak keeper in FIG. 4(b) and the dual NMOS's in FIG. 4(c) can receive a clock signal synchronous with the original CAM cell set; therefore, propagation delay and extra power consumption will appear. In the evaluation phase, if the stored data does not match the searched data, the pull-down NMOS will discharge the floating node to the ground voltage level theoretically. When the pull-down NMOS cannot effectively discharge the floating node to the ground voltage level, the keeper and the pull-down NMOS will turn on simultaneously; however, it will cause strong direct current and intense noise; besides, the feedback path of the conventional keeper will further worsen propagation delay.

When the match-line architectures, which the abovementioned conventional keepers apply to, intend to achieve a given noise immunity, they have to confront the problems of propagation delay and high power consumption. Accordingly, the present invention proposes an XOR-based conditional keeper and an architecture implementing its application to match lines to overcome the abovementioned problems and obtain an optimal compromise among high noise immunity, high processing speed and low power consumption.

SUMMARY OF THE INVENTION

The primary objective of the present invention is to provide an XOR-based conditional keeper, which utilizes XOR logic to control the keeper to execute appropriate corresponding actions in different conditions and can replace the original keeper having only "on" and "off" modes and can enhance noise immunity without sacrificing power consumption and processing speed.

Another objective of the present invention is to provide an XOR-based conditional keeper and an architecture implementing its application to match lines, which applies the XOR-based conditional keeper to a match-line architecture to enable the match line to execute appropriate corresponding actions in different statuses of the circuit and can replace the design which upsizes the keeper to enhance noise immunity and can promote noise immunity but still has the characteristics of low power consumption and high processing speed.

Yet another objective of the present invention is to provide an XOR-based conditional keeper and an architecture implementing its application to match lines, wherein the XOR-based conditional keeper can receive the clock signals synchronous with the CAM cell set and is applied to a match-line architecture to prevent propagation delay and massive noise.

Still another objective of the present invention is to provide an XOR-based conditional keeper, which can apply to all kinds of dynamic circuits and has the characteristics of low power consumption, high noise immunity and high processing speed.

Further another objective of the present invention is to provide an XOR-based conditional keeper and an architecture implementing its application to match lines, which can apply to a high fan-in circuit and can enhance the noise immunity therein without the penalty of processing speed and power consumption.

To achieve the above-mentioned objectives, the present invention proposes an XOR-based conditional keeper and an architecture implementing its application to match lines, wherein the XOR-based conditional keeper has an XOR gate, which can receive the clock signal and the floating signal of a dynamic circuit and creates an XOR control signal, and a P-type transistor receives the XOR control signal and creates a data signal to control the XOR-based conditional keeper, which enables the dynamic circuit to execute appropriate corresponding actions in different conditions and to have the characteristics of low power consumption, high noise immunity and high processing speed.

The present invention also proposes an embodiment to apply the XOR-based conditional keeper to a match-line architecture, wherein multiple CAM cell sets interconnected in series are coupled to at least one transistor switch and at least one XOR-based conditional keeper; the clock signal created by the CAM cell sets interconnected in series is transmitted via the transistor switch to the XOR-based conditional keeper; inside the XOR-based conditional keeper, the clock signal together with the floating signal coming from the floating node enables an XOR gate to creates an XOR control signal corresponding to the status of the dynamic circuit, and a P-type transistor receives the XOR control signal and creates a data signal corresponding to the XOR control signal to control the XOR-based conditional keeper so that the XOR-based conditional keeper can execute the optimal actions in different statuses of the circuit systems.

To enable the objectives, technical contents, characteristics, and efficacies of the present invention to be more easily understood, the preferred embodiments of the present invention are to be described below in detail in cooperation with the attached drawings.

LIST OF REFERENCE NUMERALS

Figure 1A:
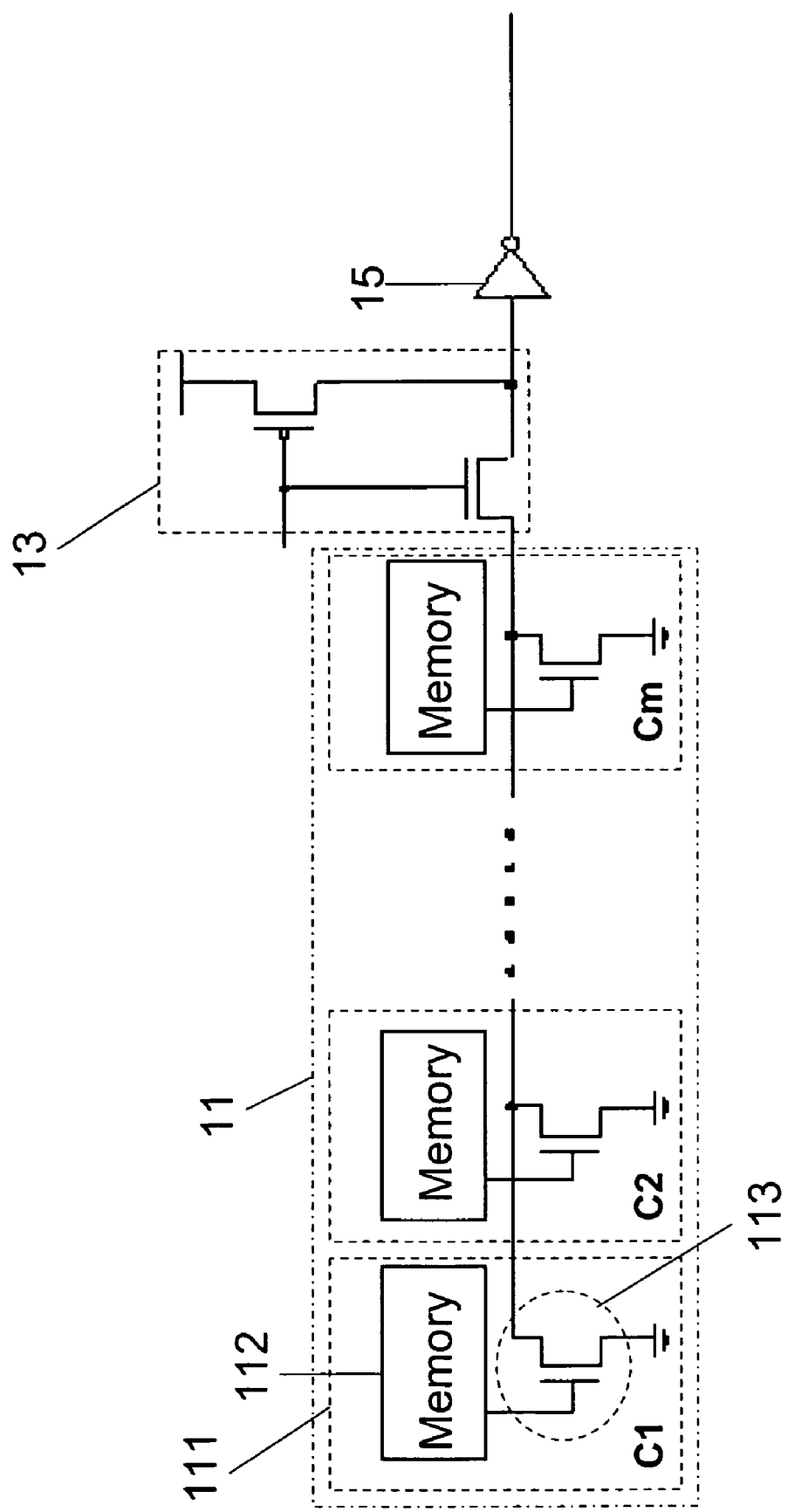
FIG. 1(a) is a diagram schematically showing the partial match-line circuit architecture of a conventional NOR-type CAM.
Figure 1B:
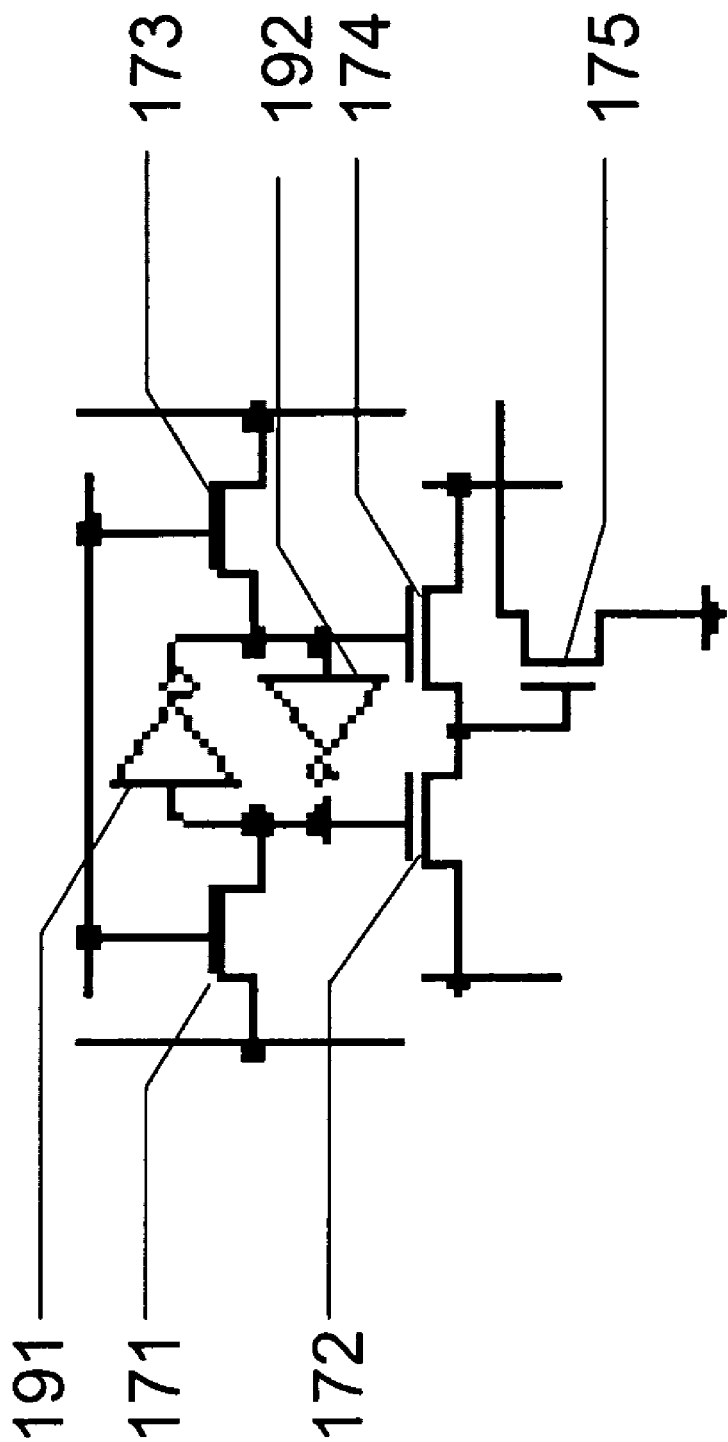
FIG. 1(b) is a diagram schematically showing the circuit of a single conventional NOR-type CAM cell.
Figure 2A:
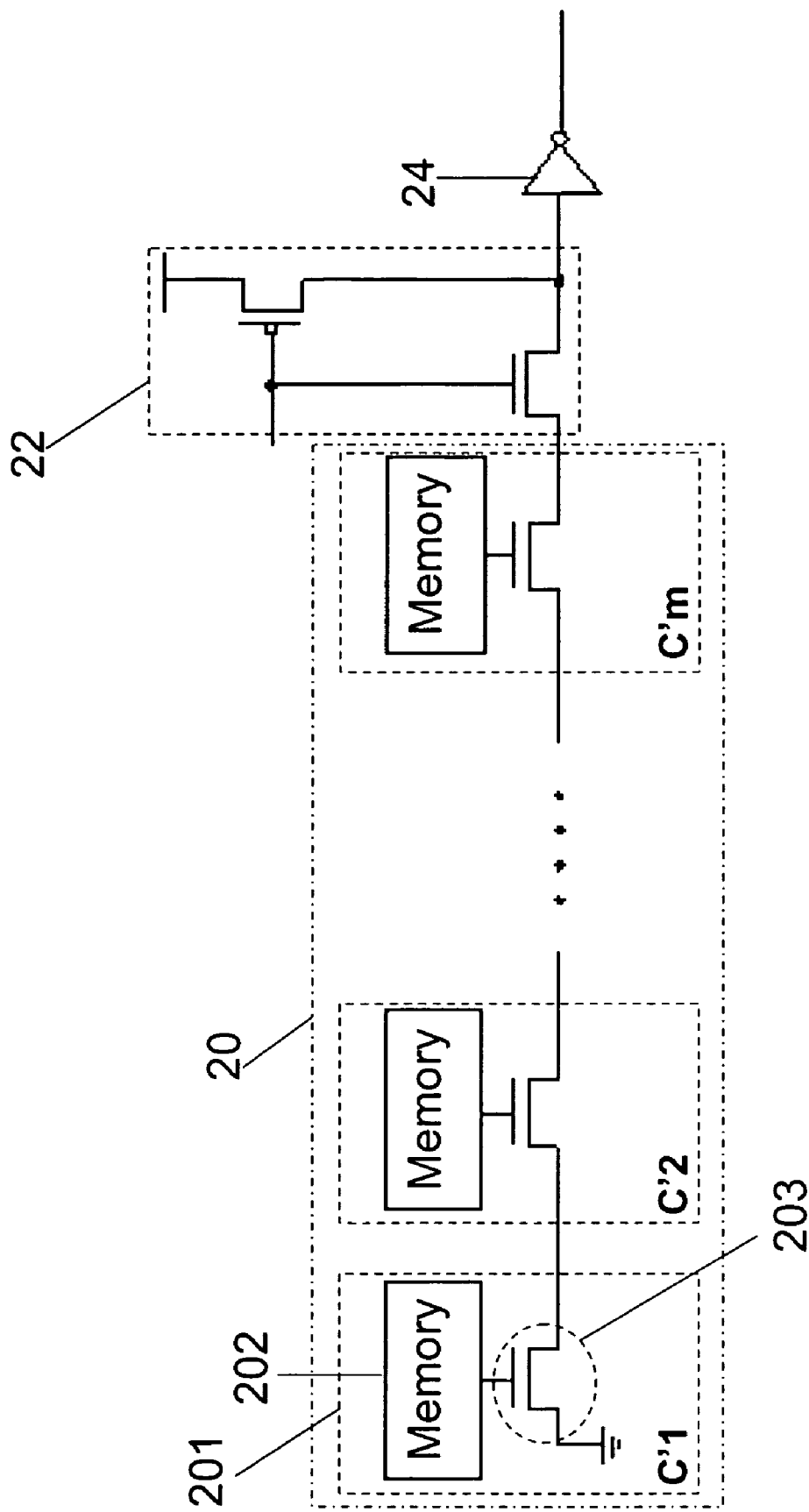
FIG. 2(a) is a diagram schematically showing the partial match-line circuit architecture of a conventional AND-type CAM.
Figure 2B:
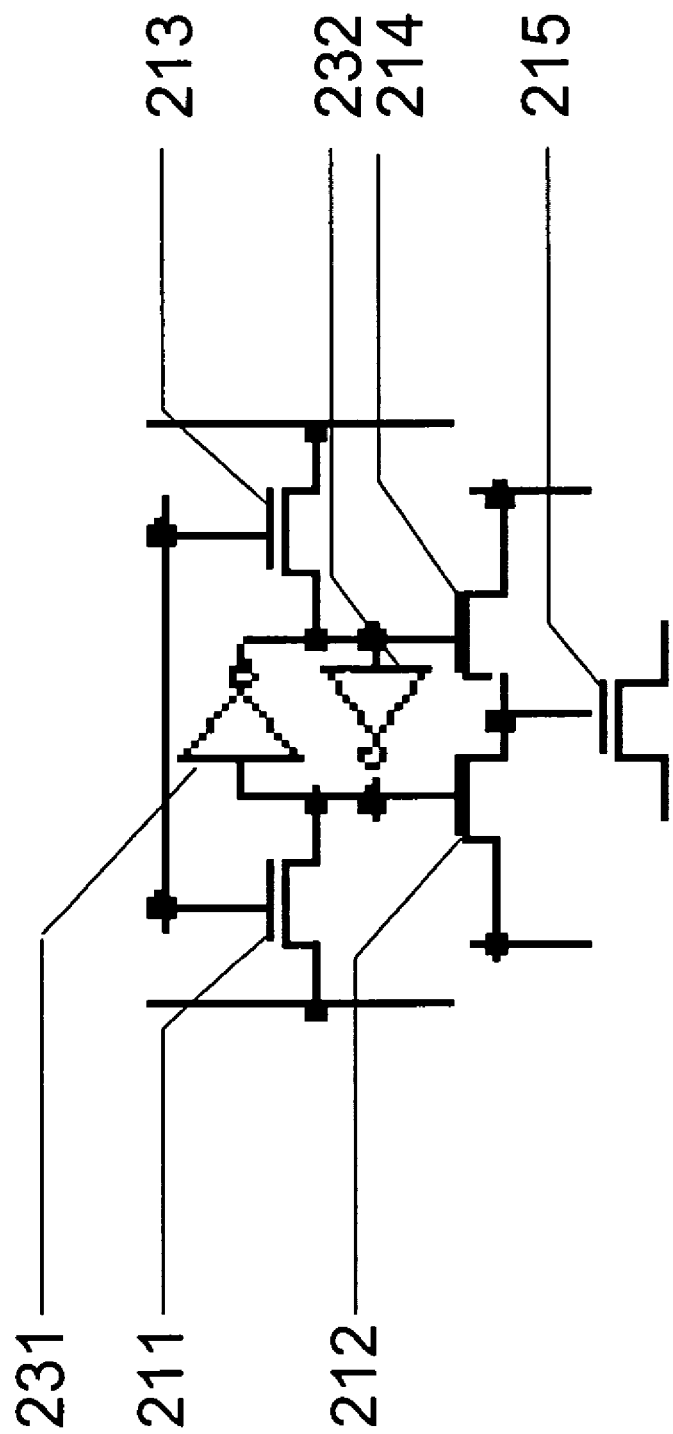
FIG. 2(b) is a diagram schematically showing the circuit of a single conventional AND-type CAM cell.
Figure 3A:
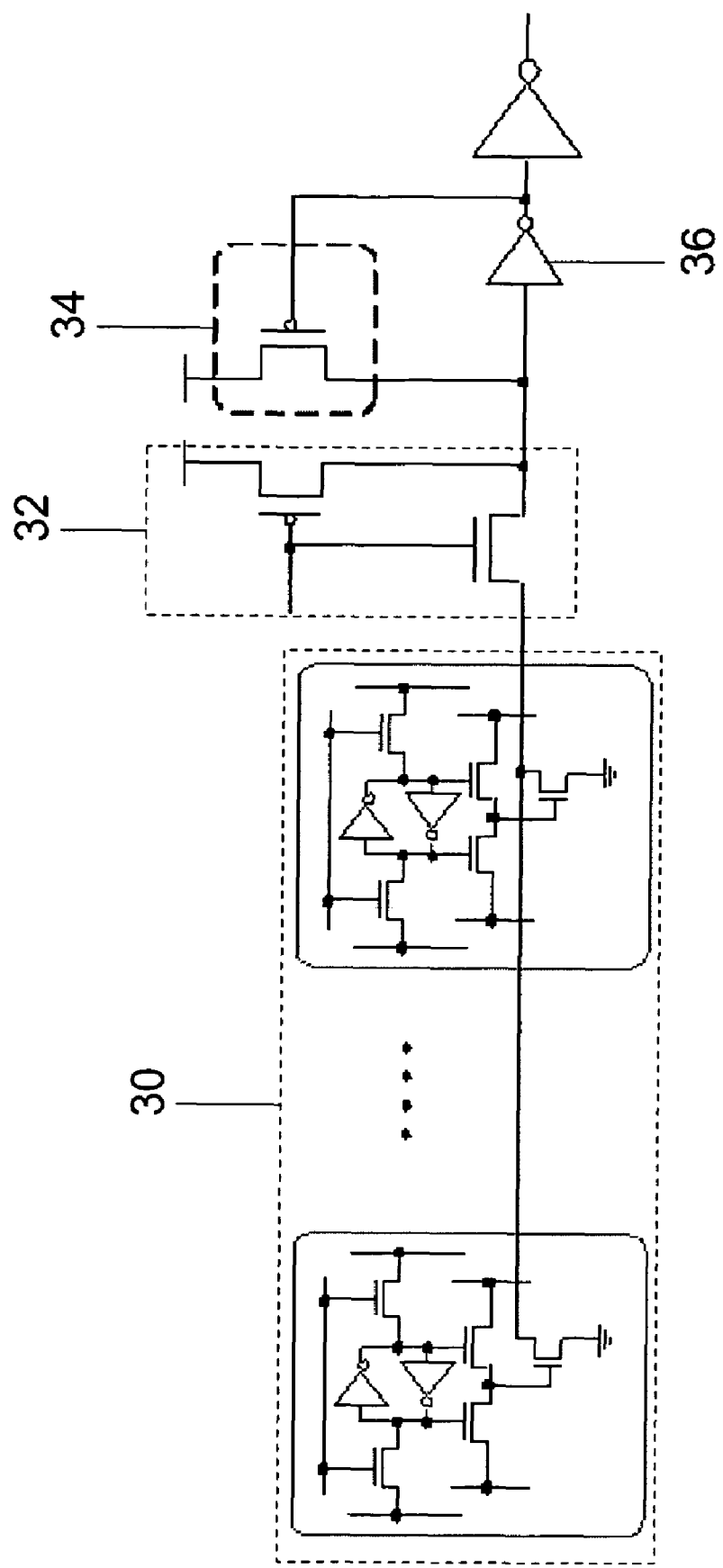
FIG. 3(a) is a diagram schematically showing the match-line circuit architecture of a conventional NOR-type CAM and a feedback keeper.
Figure 3B:
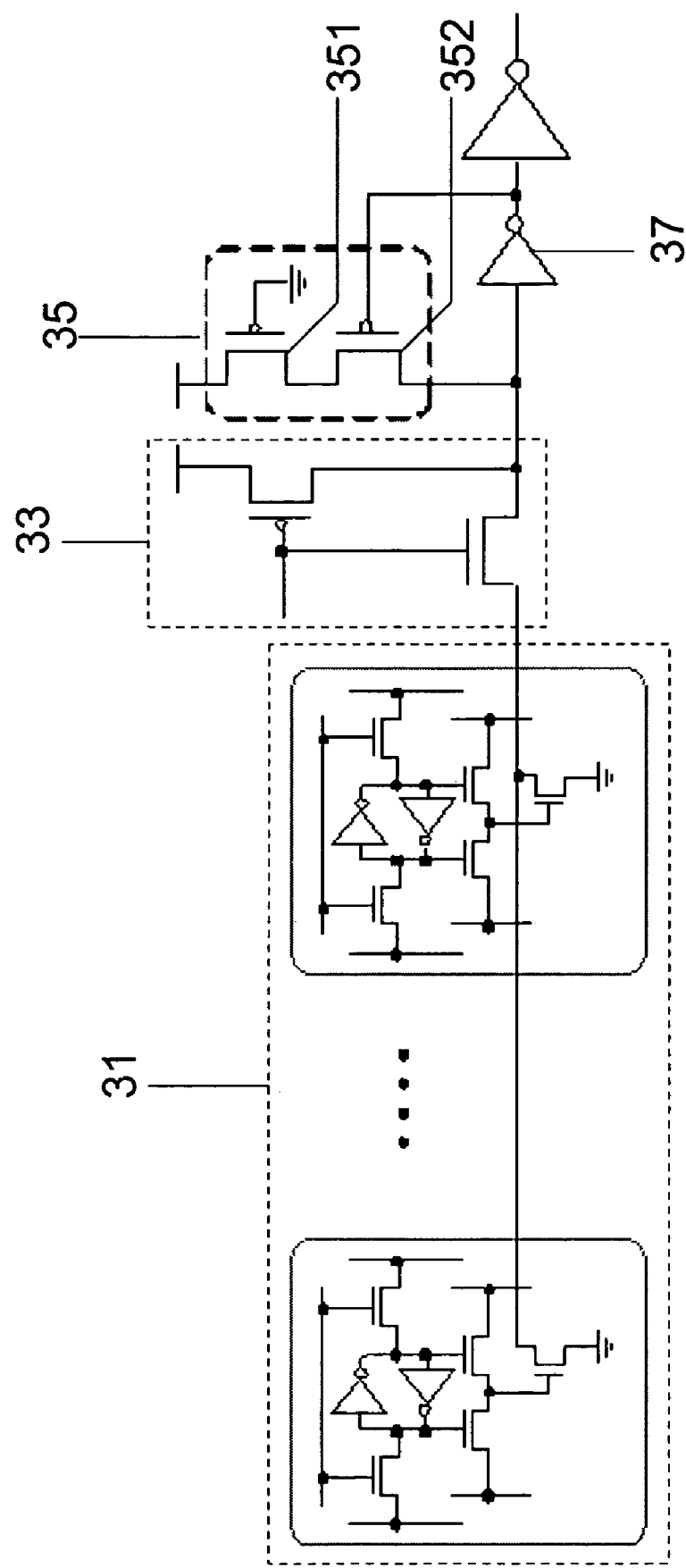
FIG. 3(b) is a diagram schematically showing the match-line circuit architecture of a conventional NOR-type CAM and a weak keeper.
Figure 4A:
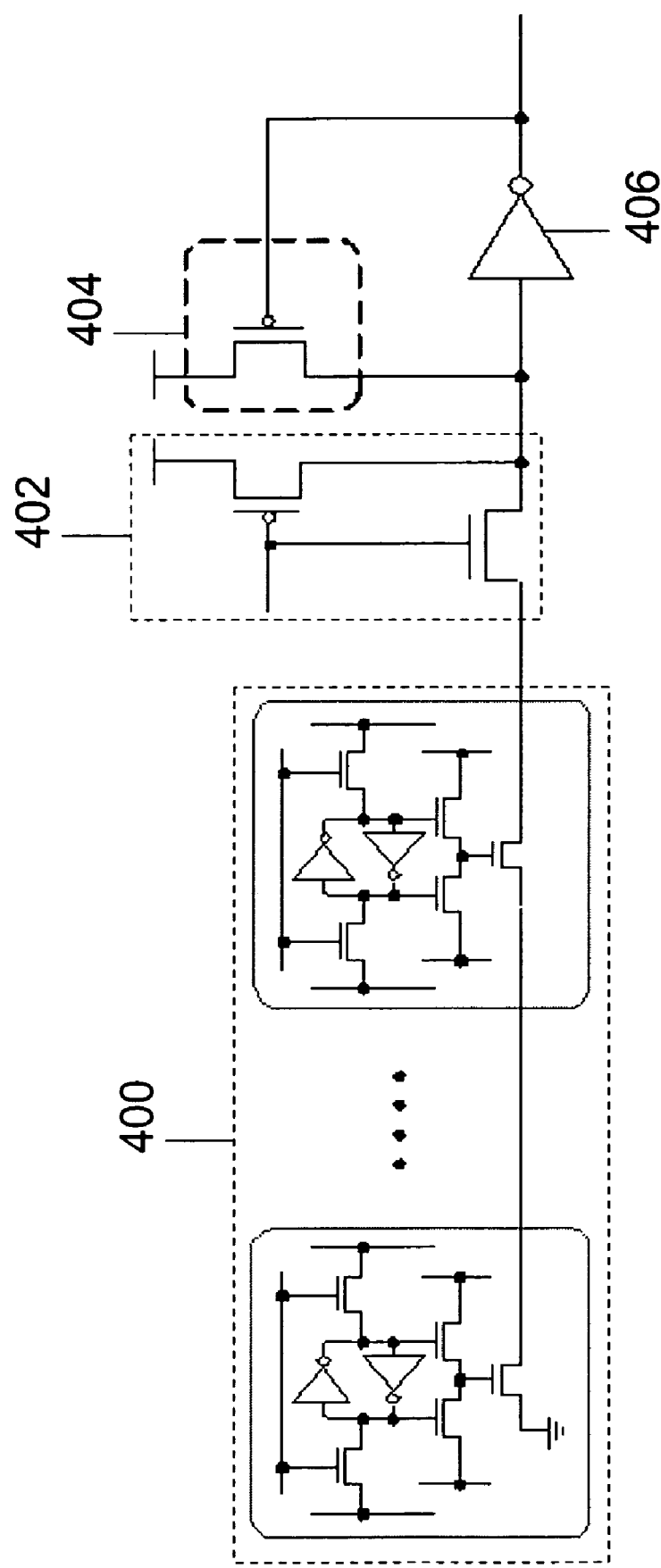
FIG. 4(a) is a diagram schematically showing the match-line circuit architecture of a conventional AND-type CAM and a feedback keeper.
Figure 4B:
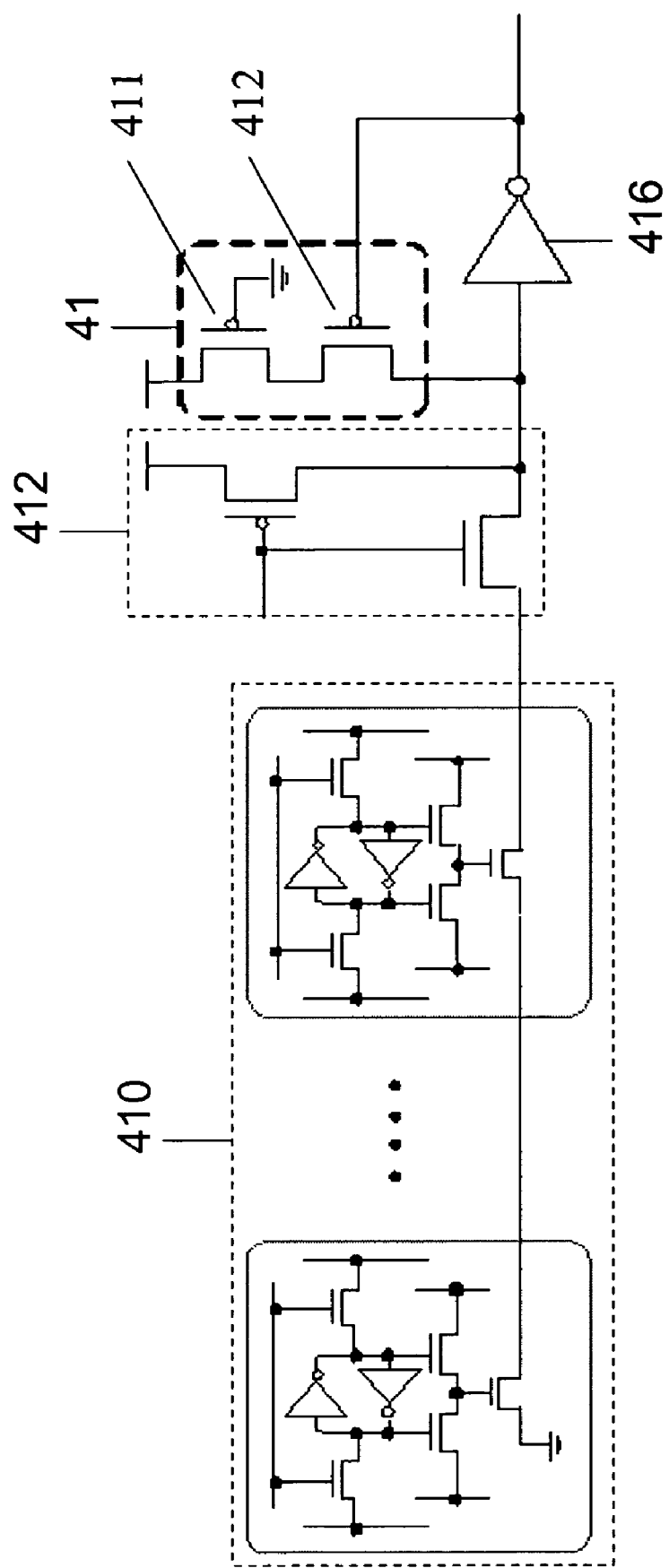
FIG. 4(b) is a diagram schematically showing the match-line circuit architecture of a conventional AND-type CAM and a weak keeper.
Figure 4C:
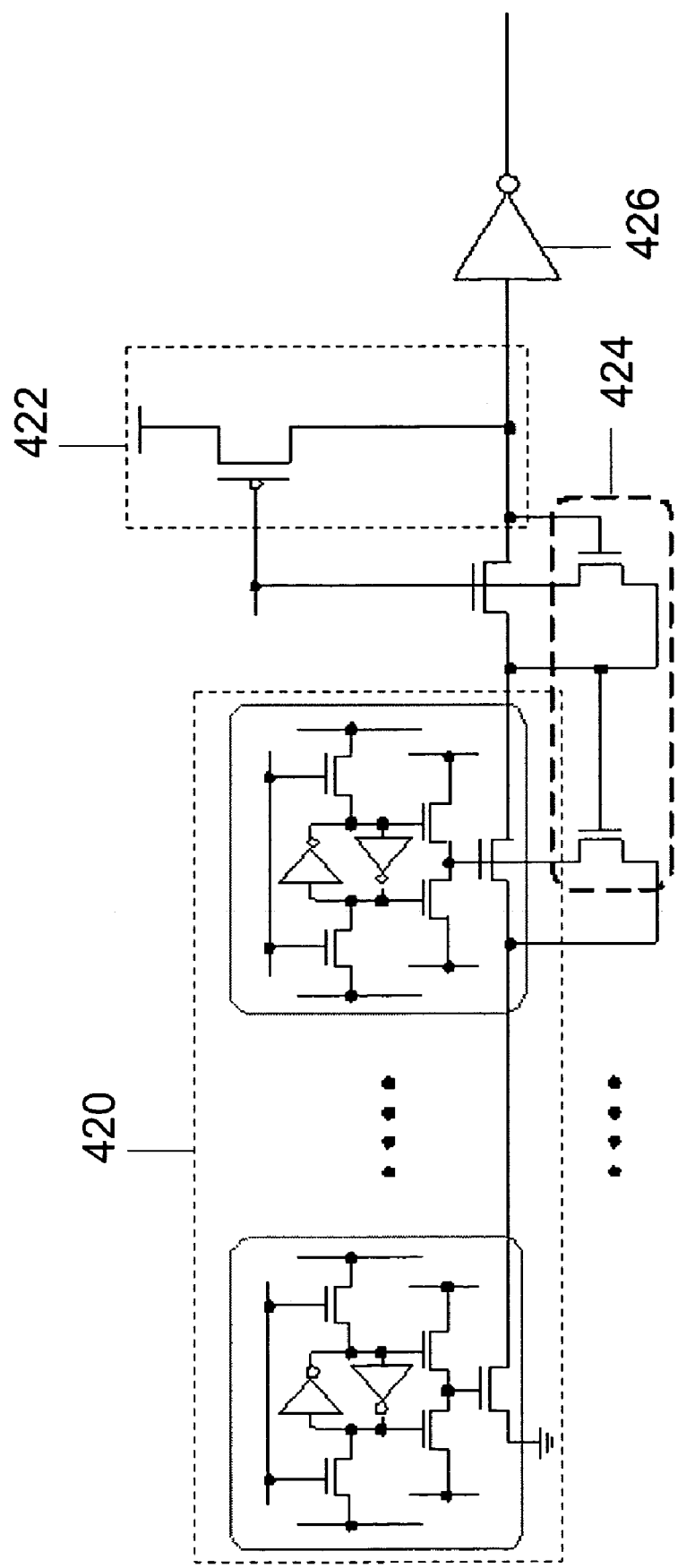
FIG. 4(c) is a diagram schematically showing the match-line circuit architecture of a conventional AND-type CAM and a dual NMOS.

11 NOR-type CAM cell set
111 NOR-type CAM cell
112 NOR-type CAM
113 pull-down NMOS
13 transistor switch
15 inverter
171, 172, 173, 174 NMOS
175 pull-down NMOS
191, 192 inverter
20 AND-type CAM cell set
201 AND-type CAM cell
202 AND-type CAM
203 pull-down NMOS
22 transistor switch
24 inverter
211, 212, 213, 214 NMOS
215 pull-down NMOS
231, 232 inverter
30 NOR-type CAM cell set
32 transistor switch
34 feedback keeper
36 inverter
31 NOR-type CAM cell set
33 transistor switch
35 weak keeper
351, 352 PMOS
37 inverter
400 AND-type CAM cell set
402 transistor switch
404 feedback keeper
406 inverter
410 AND-type CAM cell set
412 transistor switch
41 weak keeper
411, 412 PMOS
420 AND-type CAM cell set
422 transistor switch
424 dual NMOS's
426 inverter
50 NOR-type CAM cell set
52 transistor switch
54 XOR-based conditional keeper
541 XOR gate
542 PMOS
56 floating node
58 inverter
51, 53, 55 transistor set
511, 531, 551 PMOS
512, 532, 552 NMOS
70 AND-type match-line PF-CDPD system
72 TCAM sub-array
74 TCAM sub-array set

DETAILED DESCRIPTION OF THE INVENTION

The dynamic circuits, especially the high fan-in circuit, are very sensitive to noise, and the keeper is usually upsized to enhance noise immunity; however, it will increase power consumption and decrease processing speed. In the Internet communication, CAM (Content Addressable Memory) is a critical circuit and has to meet severe demands in processing speed and power consumption and should be able to rapidly and massively compare data. In principle, the design of the dynamic circuit architectures has to meet three main requirements: high noise immunity, high processing speed and low power consumption. The XOR-based conditional keeper and an architecture implementing its application to match lines of the present invention can exactly satisfy the three main requirements, and the embodiments thereof are to be described below in detail in cooperation with the drawings.

Figure 5A:
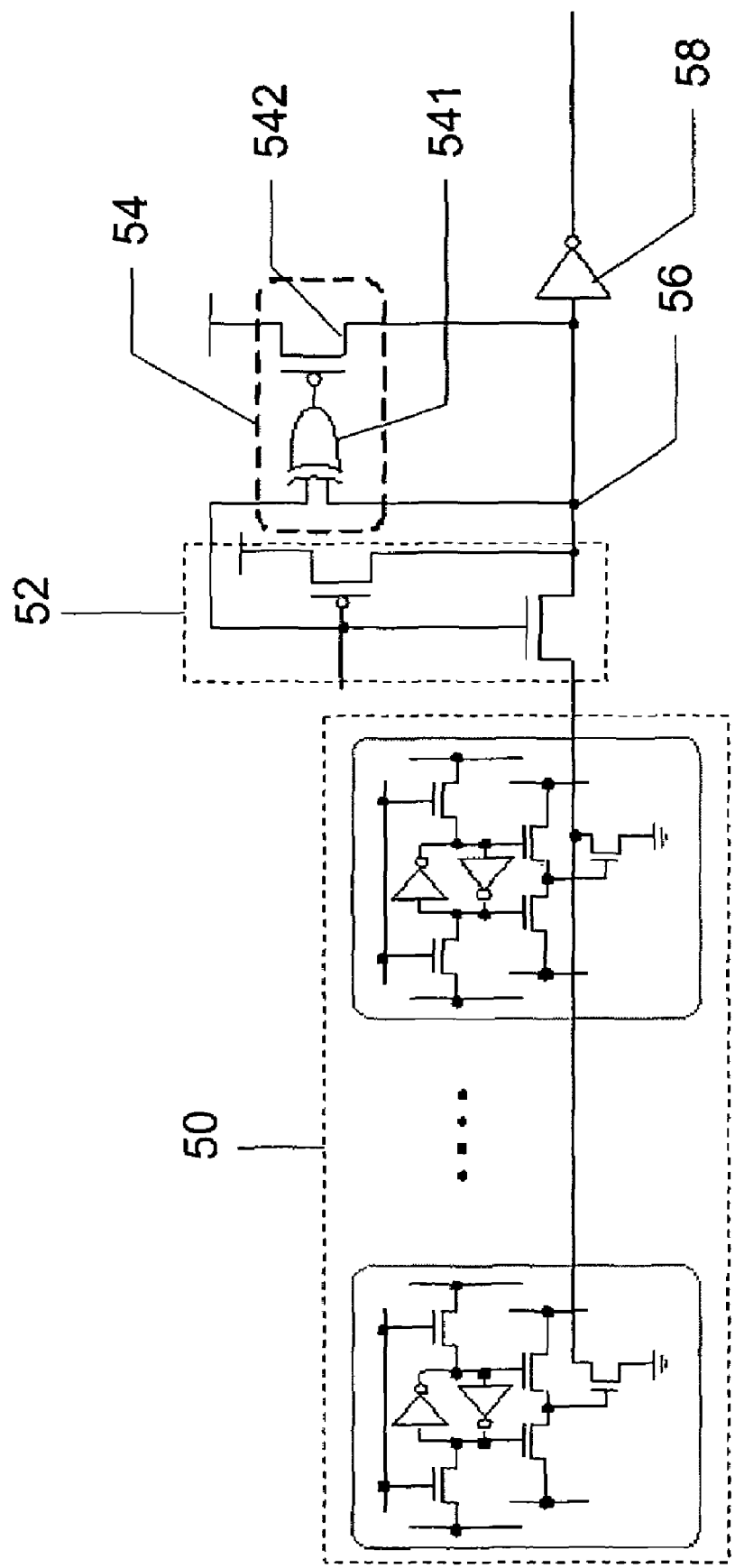
FIG. 5(a) is a diagram schematically showing the circuit architecture implementing the application of the XOR-based conditional keeper of the present invention to a dynamic NOR-type match line.

Refer to FIG. 5(a) a diagram of a first embodiment of the present invention and schematically showing the application of the XOR-based conditional keeper of the present invention to a dynamic NOR-type match line circuit architecture. The entire dynamic NOR-type match-line circuit architecture comprises: a NOR-type CAM cell set 50, formed of m NOR-type CAM cells interconnected in series; a transistor switch 52, coupled to the NOR-type CAM cell set 50, and receiving and synchronously transmitting the clock signal created by the NOR-type CAM cell set 50; and an XOR-based conditional keeper 54, receiving the clock signal synchronous with the NOR-type CAM cell set 50 from the transistor switch 52, receiving a floating signal, creating an XOR control signal, converting the XOR control signal into a data signal, and outputting the data signal. The data signal can be sent out by an inverter 58, which is coupled to the dynamic NOR-type match line circuit. As shown in FIG. 5(a), the XOR-based conditional keeper 54 further comprises: an XOR gate 541 and a PMOS 542; the XOR gate 541 receives the floating signal for the floating node 56 and the clock signal synchronous with the NOR-type CAM cell set 50 of the dynamic circuit, and according to different combinations of the floating signal and the clock signal, the XOR gate 541 will create four kinds of XOR control signals, and according to the XOR control signal, the PMOS 542 will send out a corresponding data signal. Refer to Table. 1 for the description of the abovementioned four kinds of XOR control signals. Refer to Table. 1 for the description of the abovementioned four kinds of XOR control signals. When the dynamic circuit is at the beginning of the pre-charge period, the clock signal and the floating signal received by the XOR gate 541 are both Low, and the XOR gate 541 will instantly output a Low XOR control signal to meet the circuit requirement and turn on the XOR-based conditional keeper 54 to speed up the pre-charge process. When the pre-charge process is completed and the gate is ready for evaluation, the clock signal is Low, and the floating signal is High, and the XOR gate 541 will instantly output a High XOR control signal to timely meet the circuit requirement and turn off the XOR-based conditional keeper 54 to avoid the impact on performance. When the clock signal and the floating signal are both High, the dynamic circuit is at the beginning of the evaluation phase, the floating node 56 will be eventually at the correct voltage level as long as the delay of the XOR gate 541 is larger than the propagation delay of the dynamic circuit. As the delay time of the dynamic circuit is pretty short, the XOR gate 541 will output a Low XOR control signal and slightly turn on the XOR-based conditional keeper 54 to enhance the noise immunity of the dynamic circuit at the beginning of the evaluation phase. Once the floating node 56 reaches the target value, the XOR gate 541 will control the XOR-based conditional keeper 54 to execute a corresponding action according to different input signals. Finally, the floating node 56 reaches the target value, it means that the evaluation phase is finished, and the value stored on the floating node 56 is Low, and the clock signal is High, and the XOR gate 541 will instantly output a High XOR control signal to turn off the XOR-based conditional keeper 54 in order to timely meet the circuit requirement. According to different statuses of the dynamic circuit, the XOR gate 541 can output different XOR control signals to PMOS 542, and the PMOS 542 of the XOR-based conditional keeper 54 will output a data signal corresponding to the XOR control signal, and finally, the signal is further transmitted by the inverter 58.

TABLE 1

| CLK | Floating signal | XOR control signal, corresponding action |
|---|---|---|
| Low | Low | Low, to speed up the process of pre-charge |
| Low | High | High, to avoid the impact on performance |
| High | Low | High, to turn off the XOR-based conditional keeper |
| High | High | Low, to enhance noise immunity |

Figure 5B:
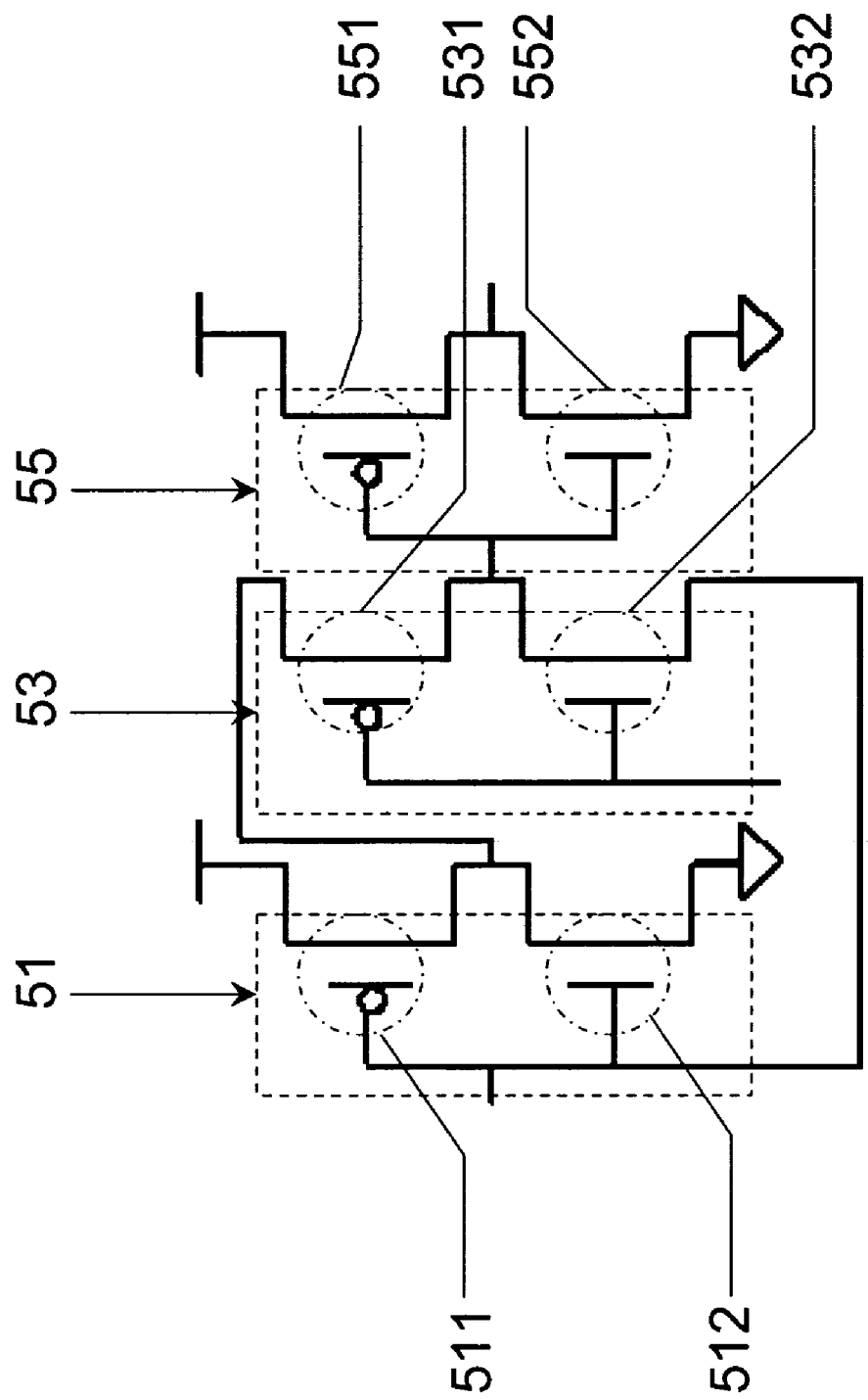
FIG. 5(b) is a circuit diagram of the XOR-based conditional keeper according to one embodiment of the present invention.

Refer to FIG. 5(*b*) for the circuit diagram of the XOR gate according to one embodiment of the present invention. The circuit shown in FIG. 5(*b*) comprises three transistor sets 51, 53, 55, and each of them is formed via coupling a PMOS (511, 531, or 551) and an NMOS (512, 532, or 552). The first transistor set 51 is electrically connected to the transistor switch (not shown in the drawing) of the dynamic circuit and receives the clock signal of the dynamic circuit. The second transistor set 53 is electrically connected to the floating node (not shown in the drawing) and receives the floating signal from the floating node; via coupling to the first transistor set 51, the second transistor set 53 can also receive the clock signal sent out by the first transistor set 51. The third transistor 55 not only can receive the floating signal received by the second transistor set 53 via coupling to the second transistor set 53 but also can receive the clock signal from the dynamic circuit via the connection between the second transistor set 53 and the first transistor set 51. Thereby, the abovementioned XOR control signals, which can vary according to the statuses of the dynamic circuit, are generated.

Figure 6:
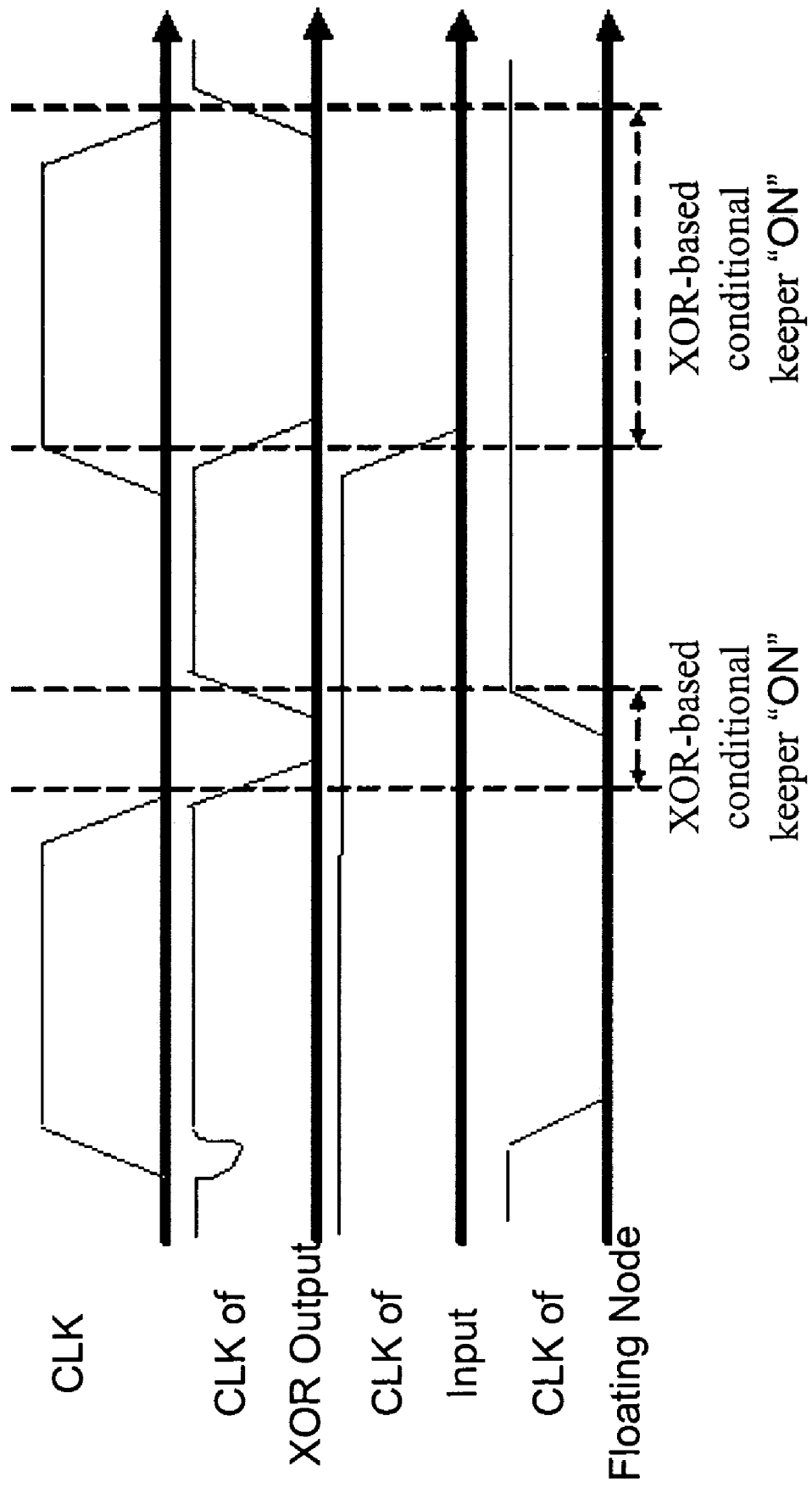
FIG. 6 is a timing diagram of the dynamic NOR-type CAM match-line circuit architecture utilizing the XOR-based conditional keeper of the present invention.

According to different statuses of the dynamic match-line circuit, the XOR-based conditional keeper create different signal to control corresponding actions. The clock timing of the XOR control signal and the other signals are shown in FIG. 6, which is a timing diagram of the NOR-type match-line architecture utilizing the XOR-based conditional keeper. When the NOR-type match-line circuit architecture utilizing the XOR-based conditional keeper is in the pre-charge stage, the XOR-based conditional keeper will turn on to charge the floating node. During the evaluation stage, if the searched data is the same as the stored data, the floating node will maintain at High logic, and the XOR-based conditional keeper will slightly turn on to enhance the noise immunity of the system; if the searched data does not match the stored value, the match-line circuit will discharge the floating node, and the XOR-based conditional keeper will turn off. From those discussed above, it can be concluded: in the dynamic match-line architecture utilizing the XOR-based conditional keeper, the XOR-based conditional keeper can instantly and effectively change the action of the entire system according to the status of the circuit system, and thereby, high processing speed and low power consumption can be achieved.

The spirit of the present invention has disclosed above, and three NOR-type 64-bit match-line circuit architectures separately having the conventional feedback keeper, the conventional weak keeper, and the XOR-based conditional keeper disclosed in the present invention are to be compared and discussed below.

Figure 7A:
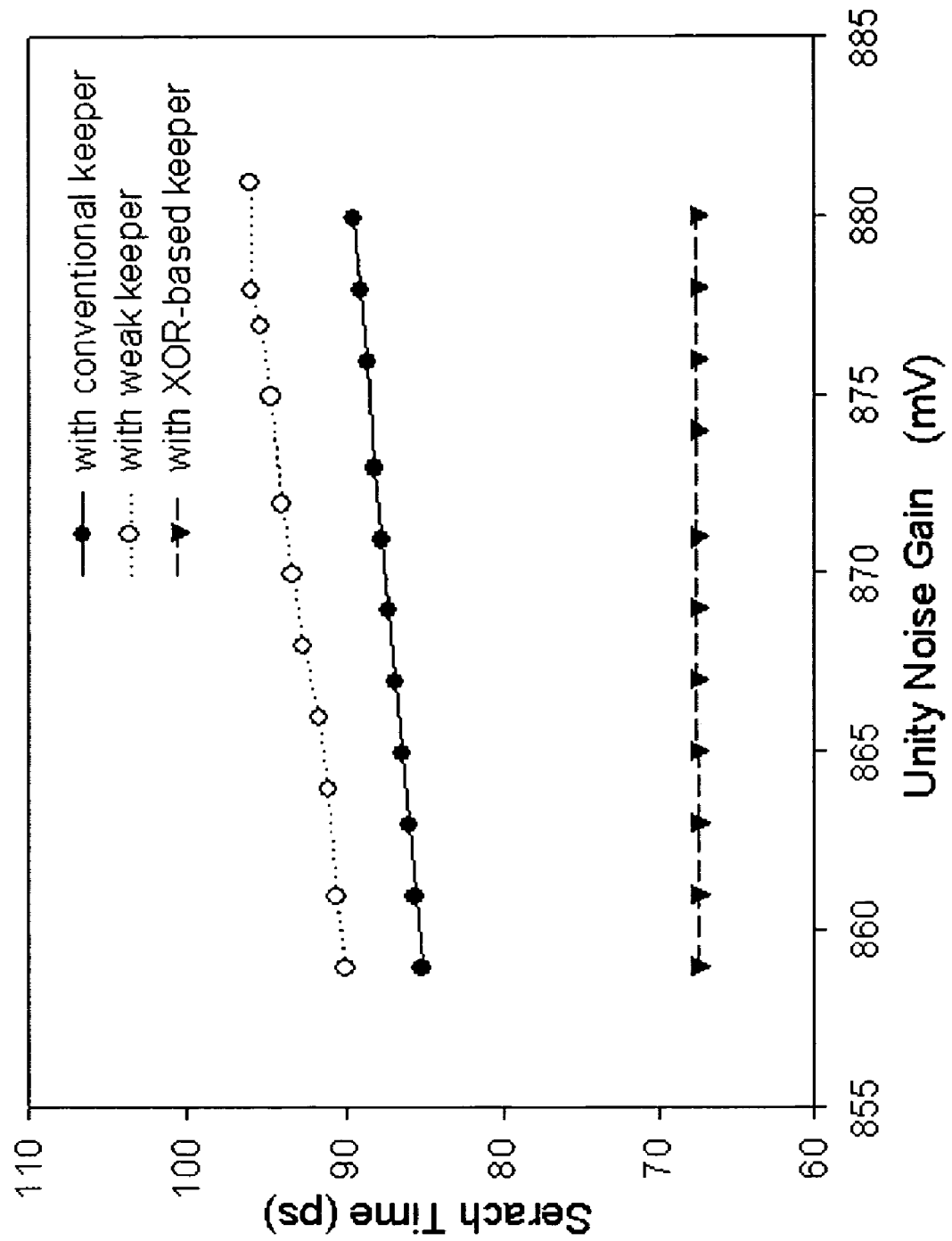
FIG. 7(a), FIG. 7(b) and FIG. 7(c) are diagrams respectively showing the test results of the dynamic NOR-type CAM match-line circuit architectures separately using the XOR-based conditional keeper, the feedback keeper and the weak keeper, wherein the searching time, power consumption and energy consumption are measured with respect to Unity Noise Gain.
Figure 7B:
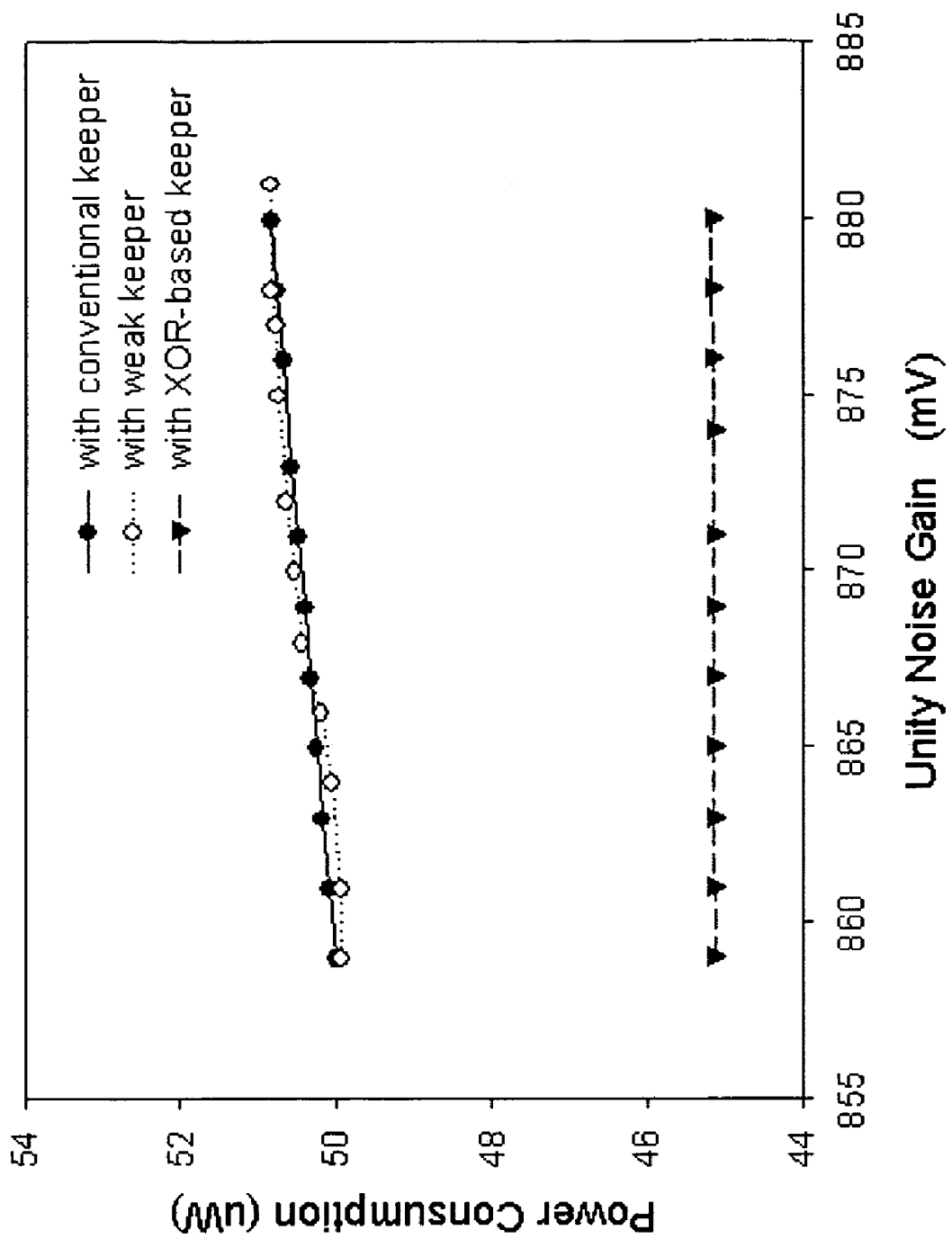
Figure 7C:
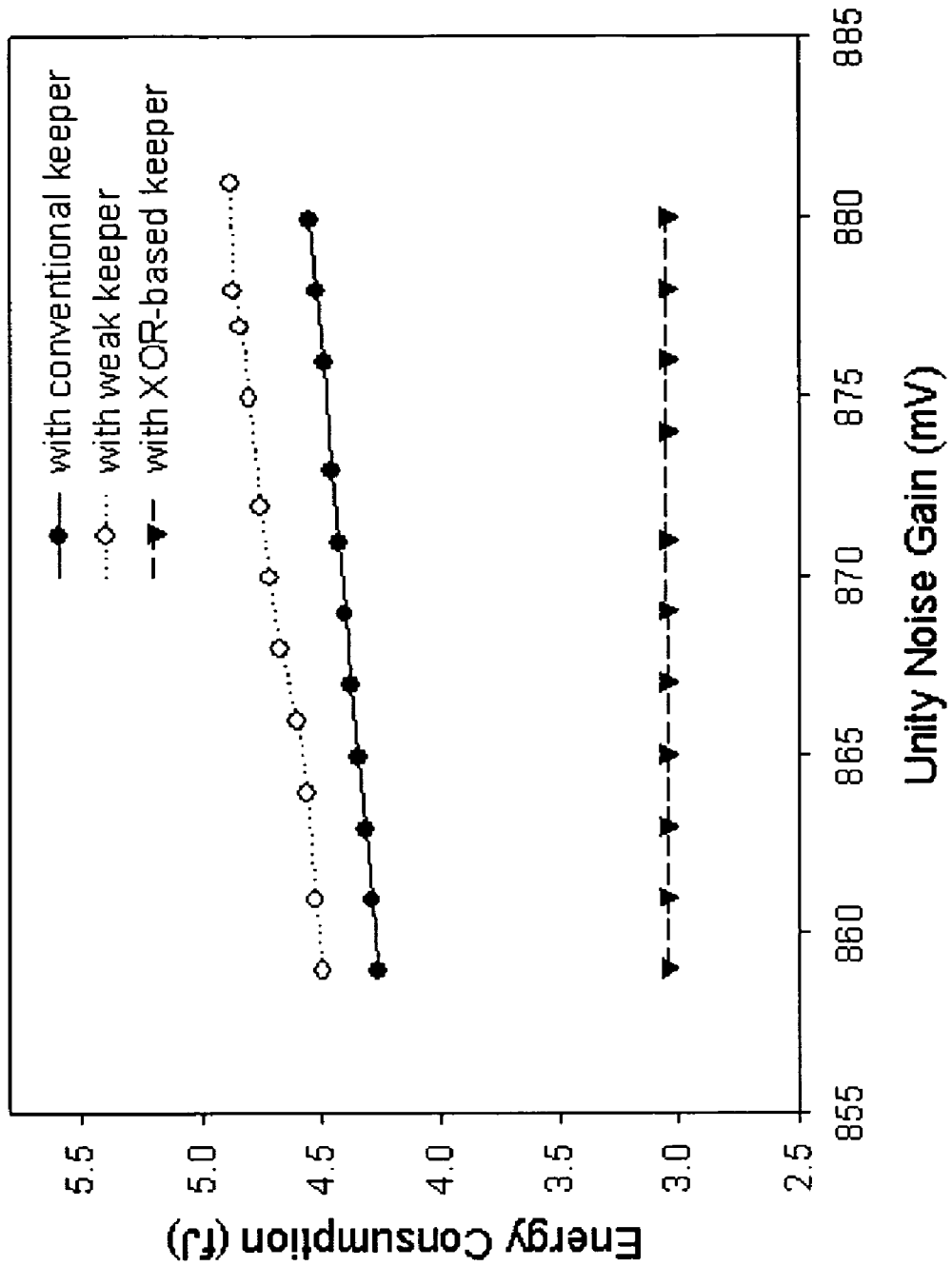

Firstly, the noise tolerance thereof is to be compared. The keeper strength is generally proportional to the size of keeper; however, in practice, the actual strength of keepers with the same size varies with their configurations. This noise tolerance ability is to be tested with the widely used UNG (Unity Noise Gain) method. Refer to FIG. 7(*a*), FIG. 7(*b*) and FIG. 7(*c*), wherein the transverse axis represents UNG, and the vertical axes thereof respectively represent searching time, power consumption and energy consumption. Among the comparisons of searching time, power consumption and energy consumption, it can be seen that the XOR-based conditional keeper has obvious noise immunity. Within the test range of from 855 to 885 mV, the searching time of the XOR-based conditional keeper of the present invention can maintain below 70 picosecond, and the power consumption of the XOR-based conditional keeper of the present invention can maintain at about 45 μw, and the energy consumption of the XOR-based conditional keeper of the present invention can maintain at about 3 f J. Compared with the conventional keepers, the XOR-based conditional keeper of the present invention has an outstanding performance.

Figure 8A:
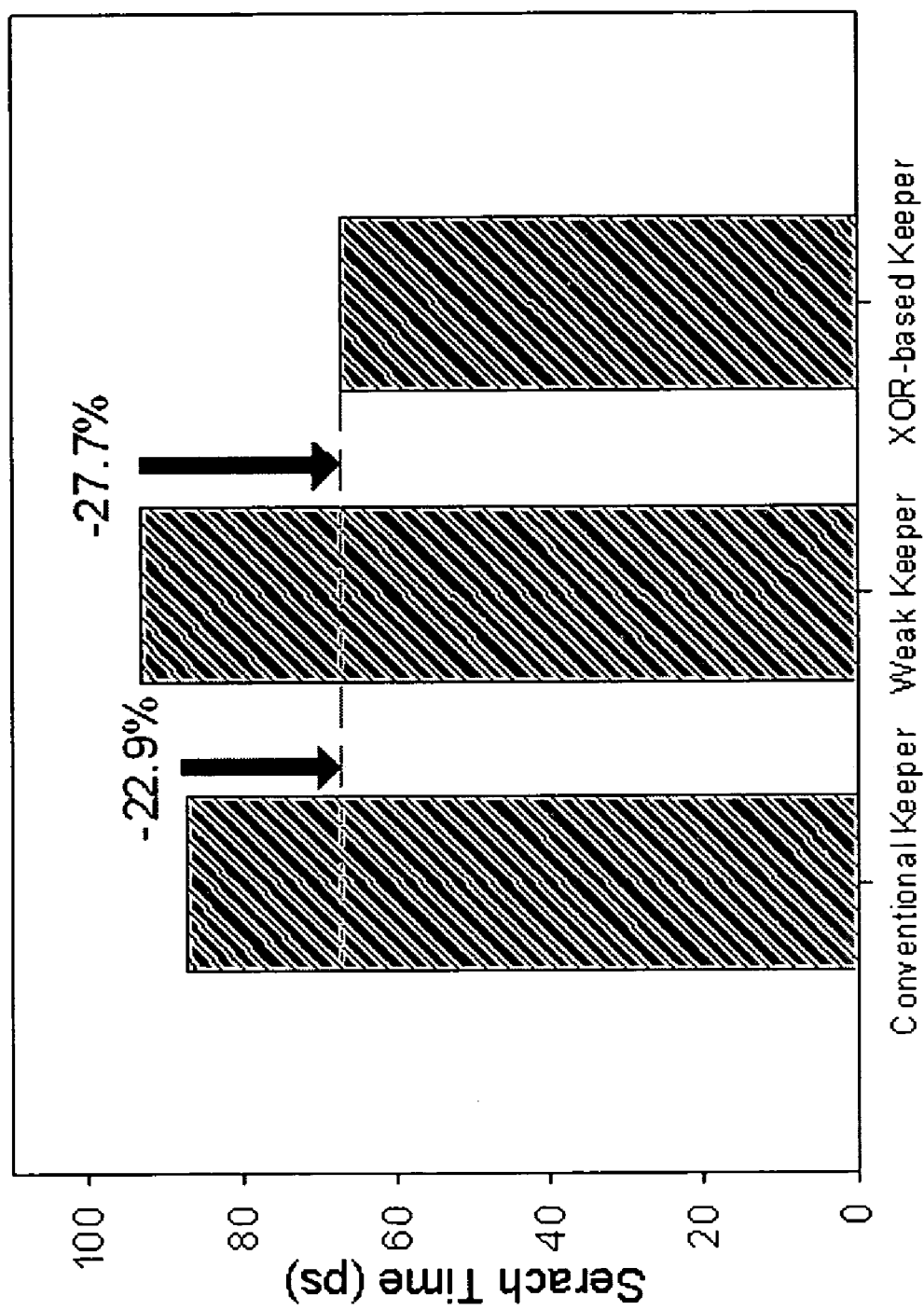
FIG. 8(a), FIG. 8(b) and FIG. 8(c) are column charts respectively showing the test results of the dynamic NOR-type CAM match-line circuit architectures separately using the XOR-based conditional keeper, the feedback keeper and the weak keeper, wherein the searching time, power consumption and energy consumption are measured with respect to Unity Noise Gain.
Figure 8B:
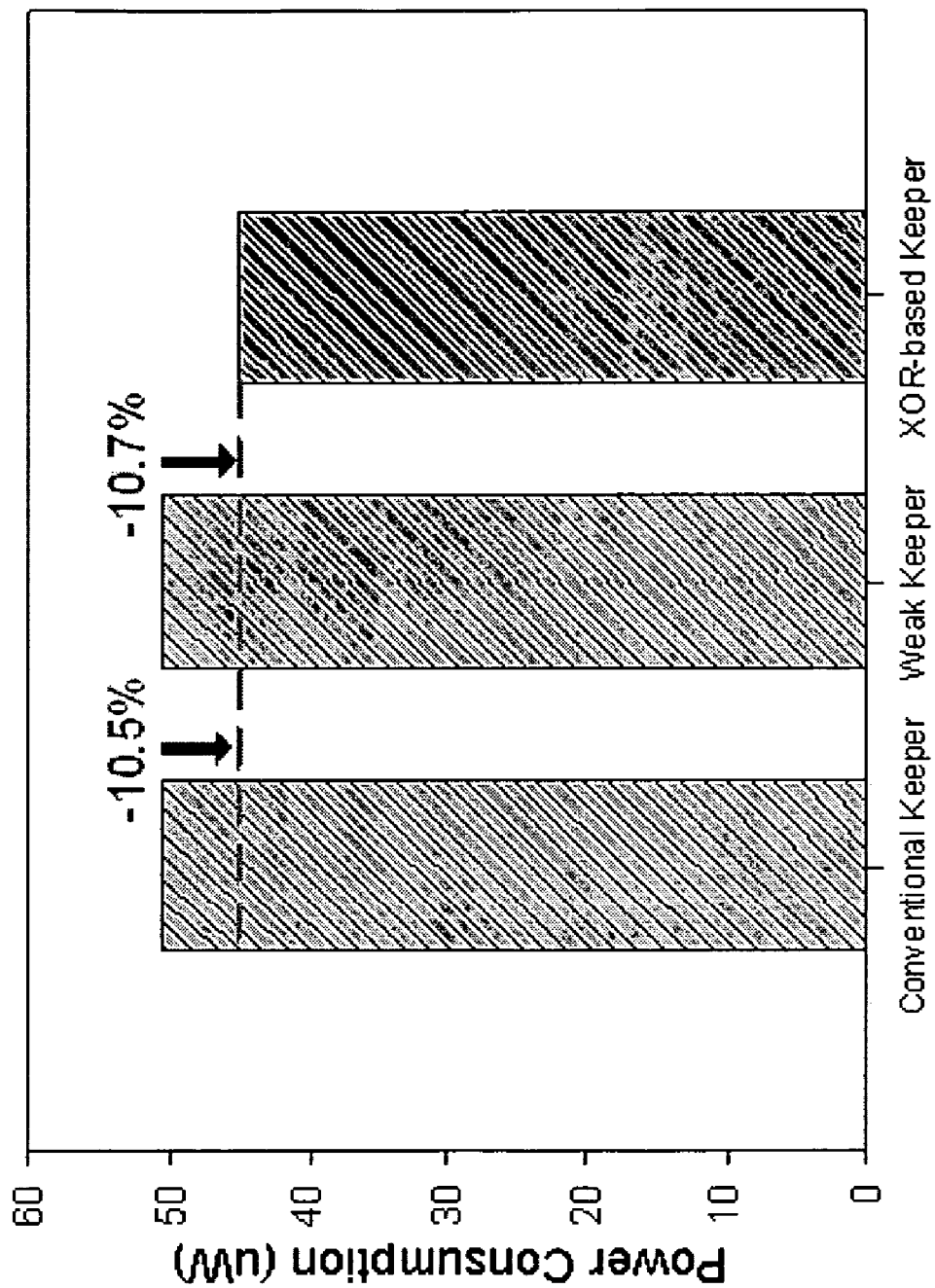
Figure 8C:
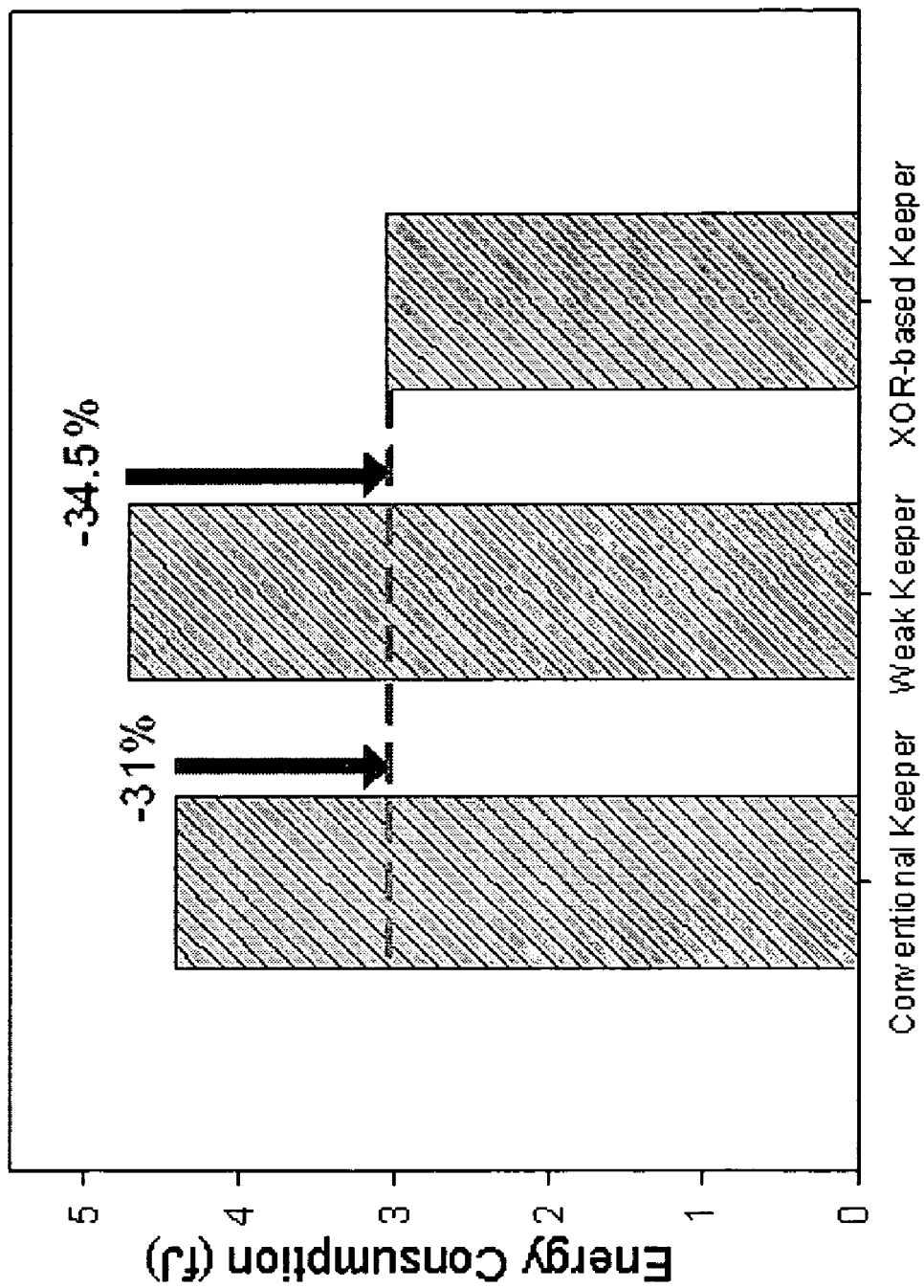

Refer to FIG. 8(*a*), FIG. 8(*b*) and FIG. 8(*c*), wherein the searching time, power consumption and energy consumption at the UNG of 870 mV of the match-line circuit architectures separately having the above-mentioned three kinds of keepers are respectively shown in three column charts. In searching time, the XOR-based conditional keeper of the present invention outperforms the conventional feedback keeper by 22.9% delay reduction and outperforms the conventional weak keeper by 27.7% delay reduction. In power consumption, the XOR-based conditional keeper of the present invention outperforms the conventional feedback keeper by 10.5% power saving and outperforms the conventional weak keeper by 10.7% power saving. In energy consumption, the XOR-based conditional keeper of the present invention outperforms the conventional feedback keeper by 31% energy saving and outperforms the conventional weak keeper by 34.5% energy saving.

Figure 9:
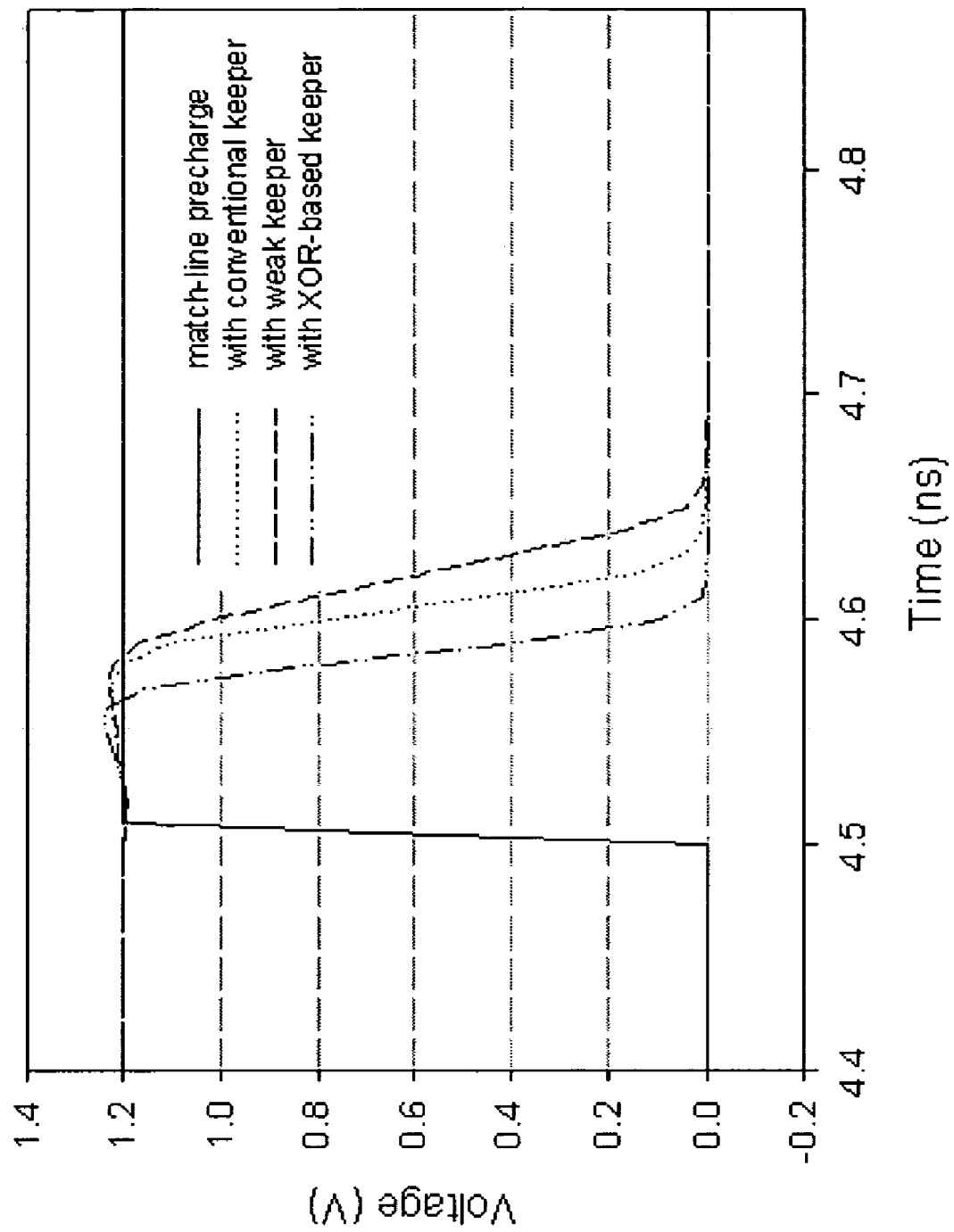
FIG. 9 is a diagram showing the waveform at a given noise intensity (870 mv) of the dynamic NOR-type CAM match-line circuit architectures separately using the XOR-based conditional keeper, the feedback keeper and the weak keeper.
Figure 10:
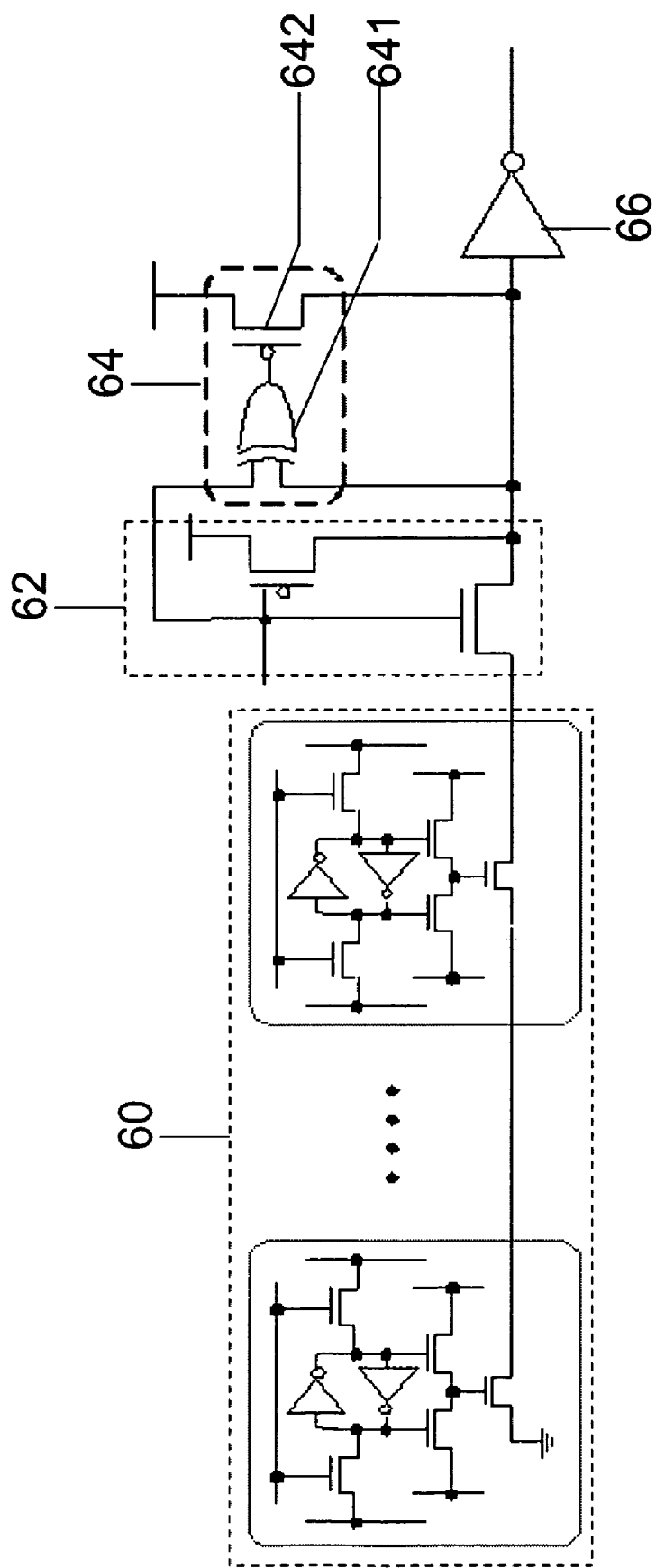
FIG. 10 is a diagram schematically showing the circuit architecture implementing the application of the XOR-based conditional keeper of the present invention to a dynamic AND-type match line.

When a bit of data is searched and the searched data does not match the stored value, the waveforms of the match-line circuit architectures separately having the above-mentioned three kinds of keepers at 870 mV of noise intensity are shown in FIG. 9. The difference between the areas overhead of the XOR-based conditional keeper and the feedback keeper is very small. In the 64-bit NOR-type match-line circuit architecture, the XOR-based conditional keeper has a 1.45% reduction in the area overhead, and in the 32-bit and 128-bit NOR-type match-line circuit architectures, the XOR-based conditional keeper separately has a 2.6% and a 0.8% reduction in the area overhead. It means that for a given noise intensity, the XOR-based conditional keeper of the present invention consumes less power than the conventional keepers.

The performance characteristics of the keepers in the dynamic NOR-type match-line circuit architecture has been discussed above, and the performance characteristics of the keepers in the dynamic AND-type match-line circuit architecture is to be discussed below. The abovementioned dynamic NOR-type match-line circuit architecture is a wide fan-in circuit, and the dynamic AND-type match-line circuit architecture is a deep fan-in circuit; therefore, keepers are usually used to diminish the charge sharing effect. Refer to FIG. 4(a), Fig. 4(b), FIG. 4(c) and FIG. 10. The dynamic AND-type match-line circuit architectures in FIG. 4(a) and FIG. 4(b) respectively adopt the feedback keeper 404 and the weak keeper 414, and the dynamic AND-type match-line circuit architecture in FIG. 4(c) adopts dual NMOS 424 as a substitute for the keeper, which are all to diminish the charge sharing effect. The dynamic AND-type match-line circuit architecture shown in FIG. 10 adopts the XOR-based conditional keeper 64 of the present invention. The XOR-based conditional keeper 64 further comprises an XOR gate 641 and a PMOS 642. An AND-type CAM cell set 60, transistor switch 62 and inverter 606 are as same as the AND-type CAM cell set 410, the transistor switch 412 and the inverter 416 in FIG. 4(b).

It is well known: for a given searching time, if one intends to reduce noise interference via the design of keepers, upsizing the keeper is inevitable; however, upsizing the keeper means elongating the circuit, which will increase the overhead area of the waveform and the power consumption. To enable characteristics of the dynamic AND-type match-line circuit architectures having different keepers to be more clearly presented, the abovementioned UNG (Unity Noise Gain) method will be used in the next section again to compare the characteristics of the feedback keeper, the weak keeper, the dual NMOS, and the XOR-based conditional keeper under different noise interference.

Figure 11A:
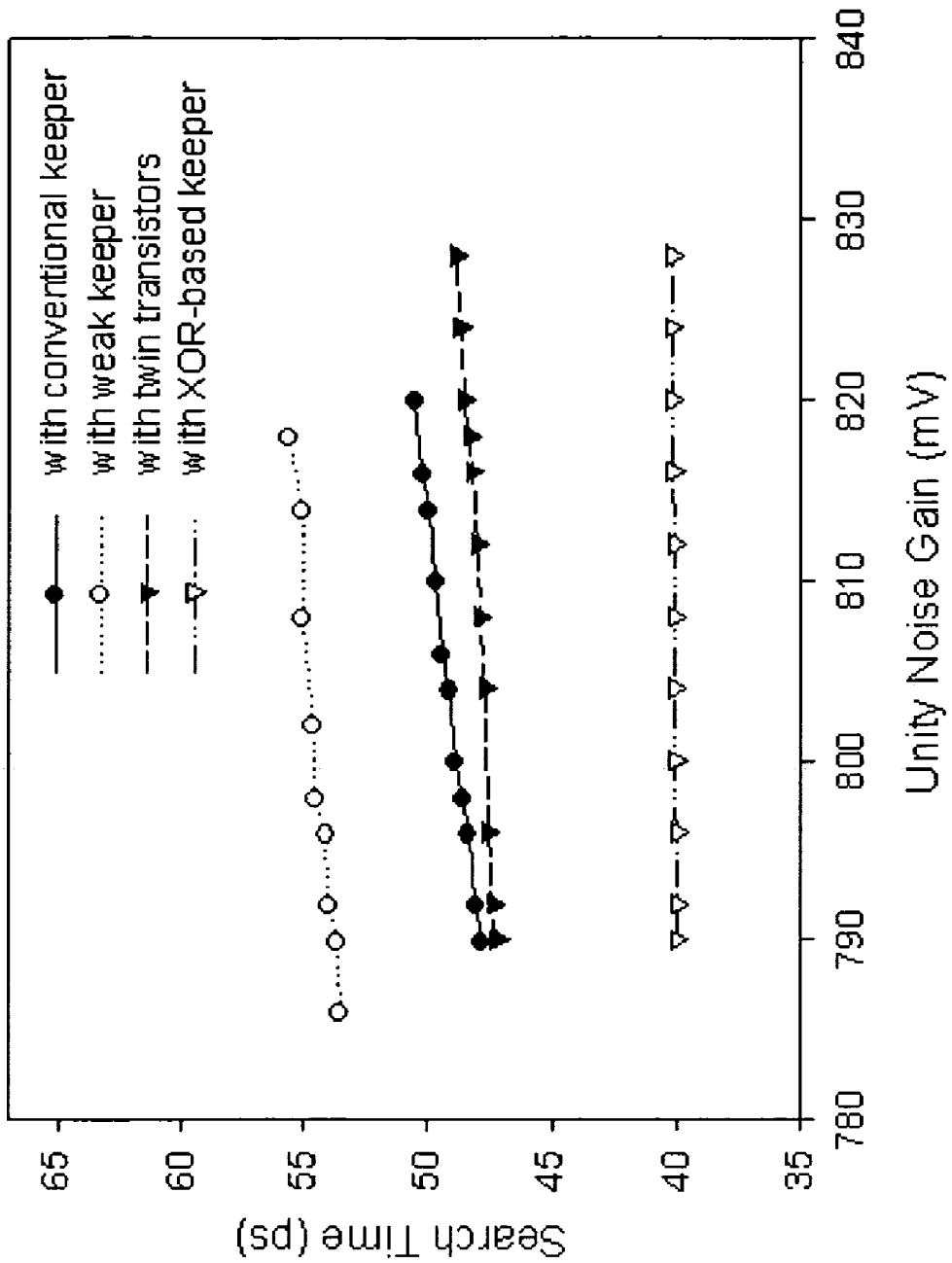
FIG. 11(a), FIG. 11(b) and FIG. 11(c) are diagrams respectively showing the test results of the dynamic AND-type CAM match-line circuit architectures separately using the XOR-based conditional keeper, the feedback keeper, the weak keeper, and the dual NMOS, wherein the searching time, power consumption and energy consumption are measured with respect to Unity Noise Gain.
Figure 11B:
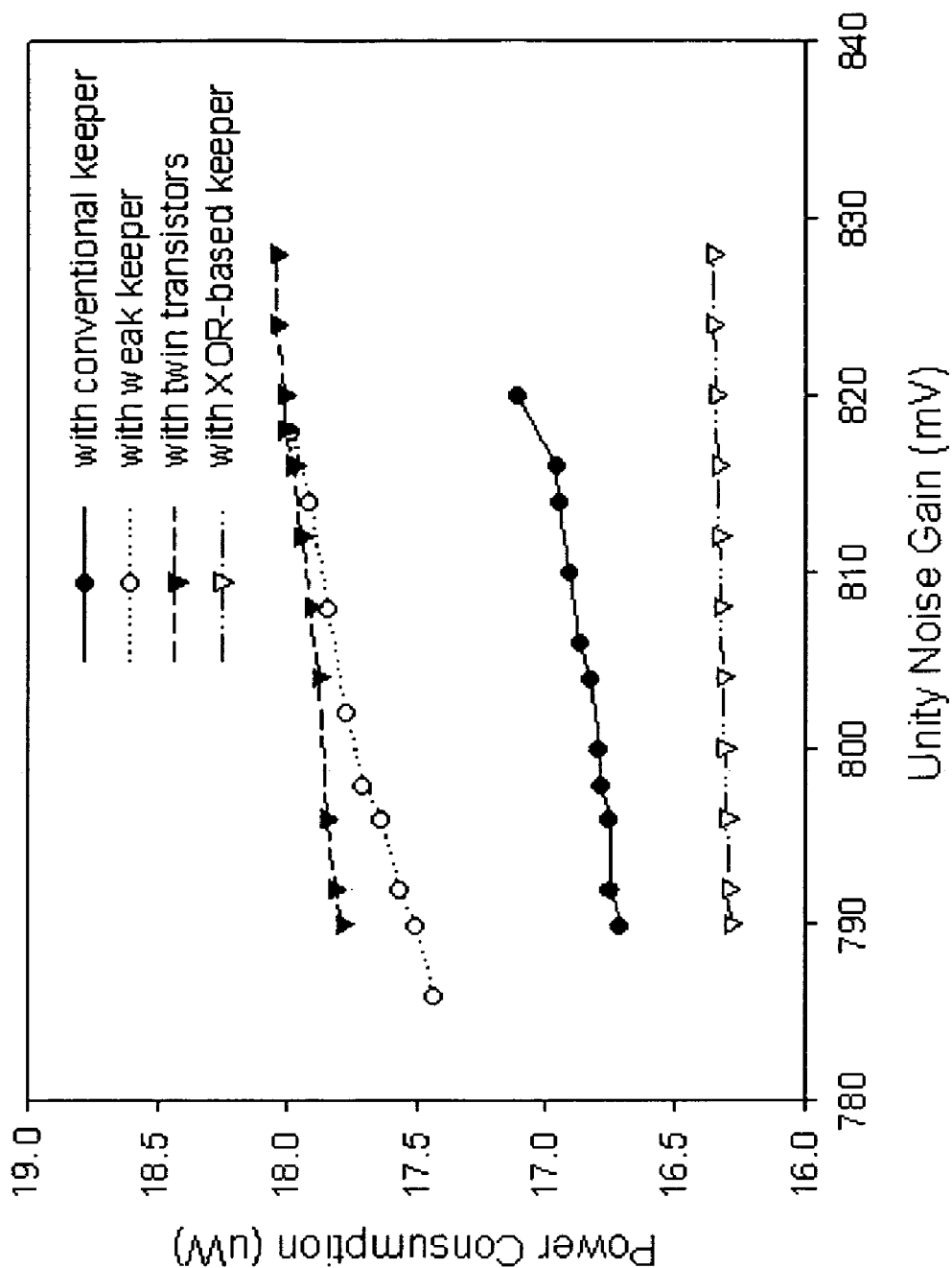
Figure 11C:
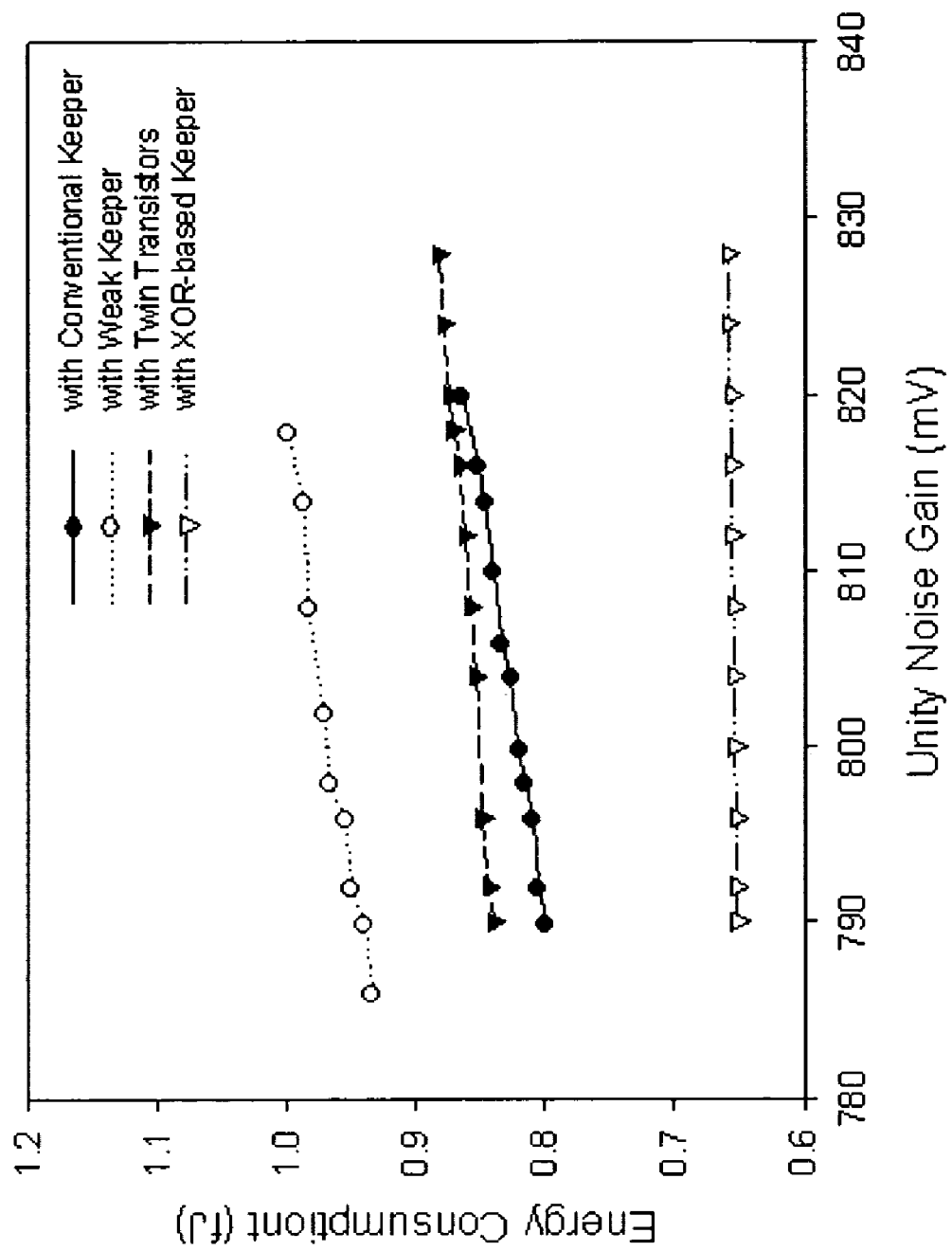

An 8-bit AND-type match-line circuit architecture is used in the UNG method. Refer to FIG. 11(a), FIG. 11(b), and FIG. 11(c), wherein the transverse axis represents UNG, and the vertical axes thereof respectively represent searching time, power consumption and energy consumption.

The comparison results are similar to those of the dynamic NOR-type match-line circuit architectures. The XOR-based conditional keeper has the shortest searching time (about 40 picosecond, as shown in FIG. 11(a)), the lowest power consumption (less than 16.5 μw, as shown in FIG. 11(b)) and the lowest energy consumption (about 0.65 f J, as shown in FIG. 11(c)).

Figure 12A:
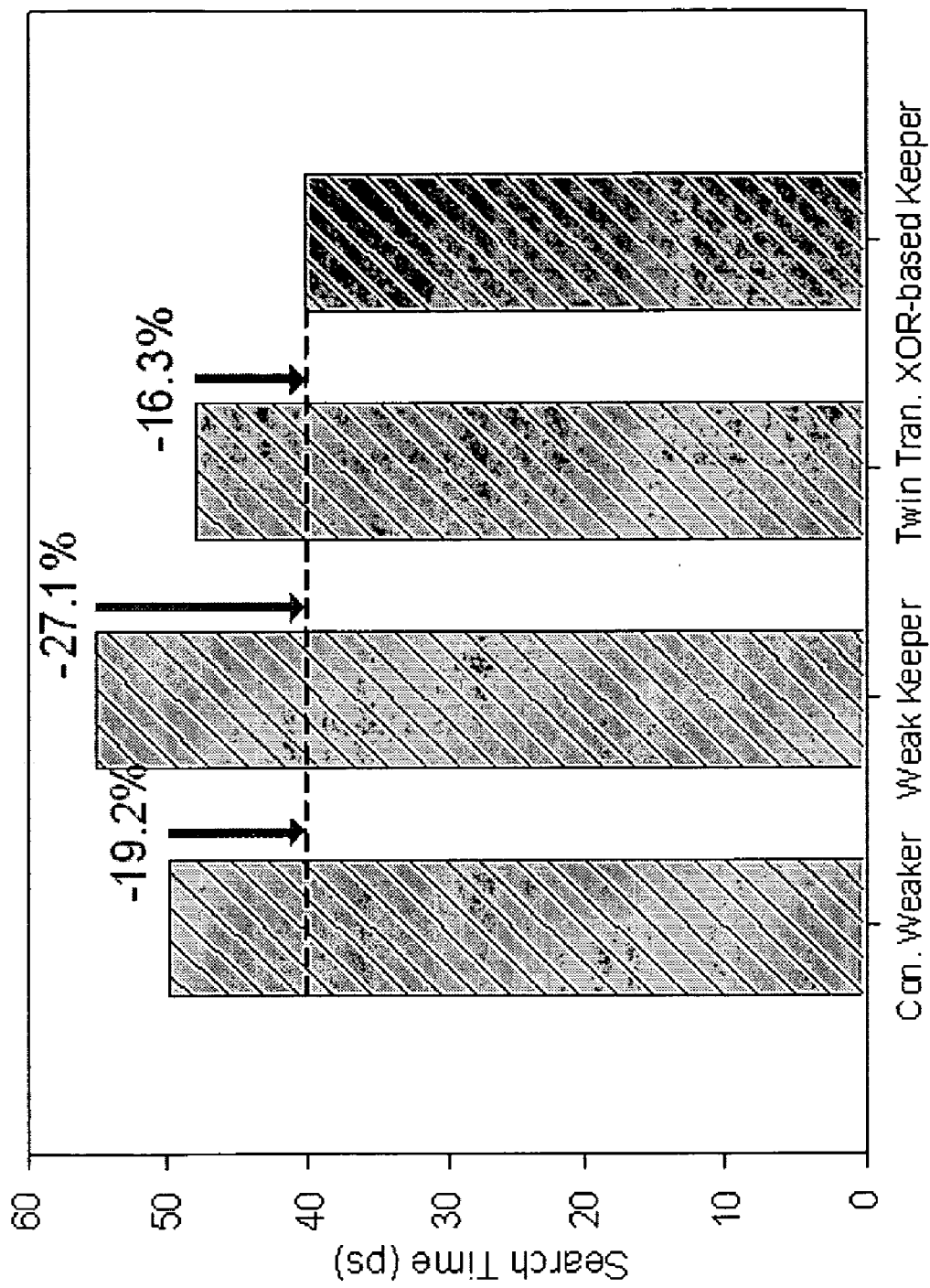
FIG. 12(a), FIG. 12(b) and FIG. 12(c) are column charts respectively showing the test results of the dynamic AND-type CAM match-line circuit architectures separately using the XOR-based conditional keeper, the feedback keeper, the weak keeper, and the dual NMOS, wherein the searching time, power consumption and energy consumption are measured with respect to Unity Noise Gain.
Figure 12B:
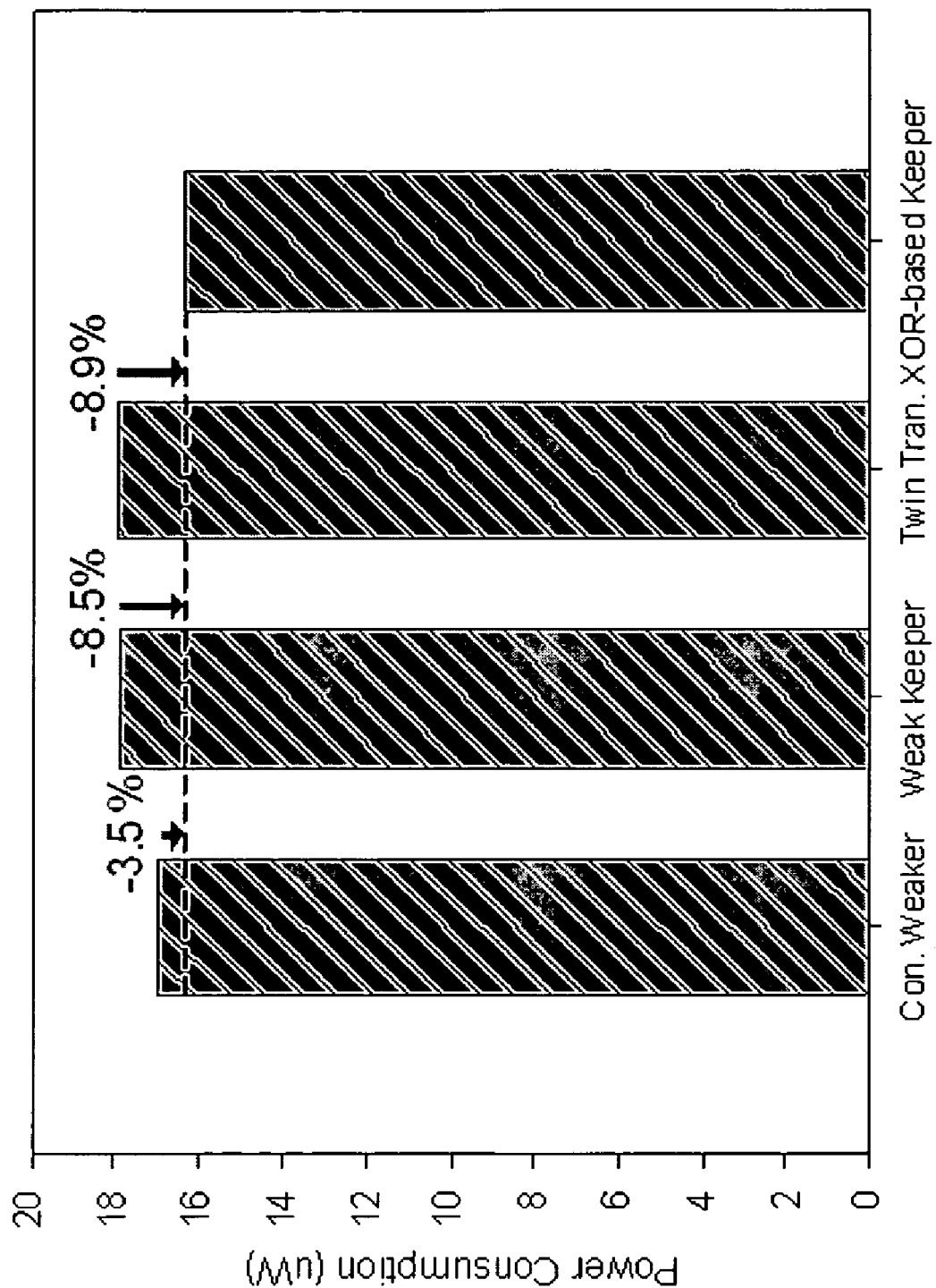
Figure 12C:
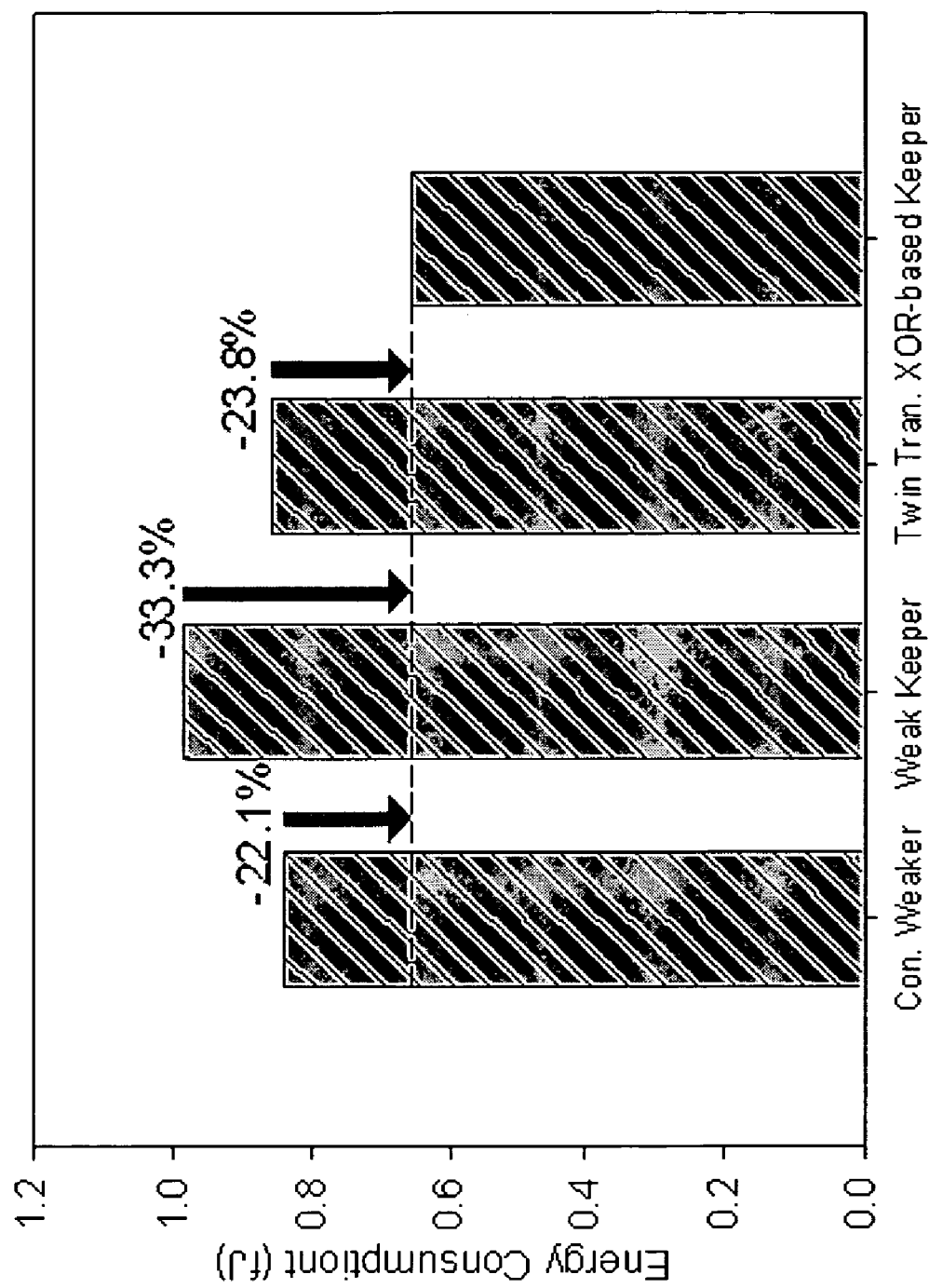

Refer to FIG. 12(a), FIG. 12(b) and FIG. 12(c), wherein the performance characteristics of the abovementioned four kinds of keepers at 810 mV of noise intensity are compared. In searching time, the XOR-based conditional keeper outperforms the feedback keeper by 19.2% delay reduction, outperforms the weak keeper by 27.1% delay reduction and outperforms the dual NMOS by 16.3% delay reduction. In power consumption, the XOR-based conditional keeper outperforms the feedback keeper, the weak keeper and the dual NMOS separately by 3.5%, 8.5% and 8.9% power saving. In energy consumption, the XOR-based conditional keeper outperforms the feedback keeper, the weak keeper and the dual NMOS separately by 22.1%, 33.3% and 23.8% energy saving.

Figure 13:
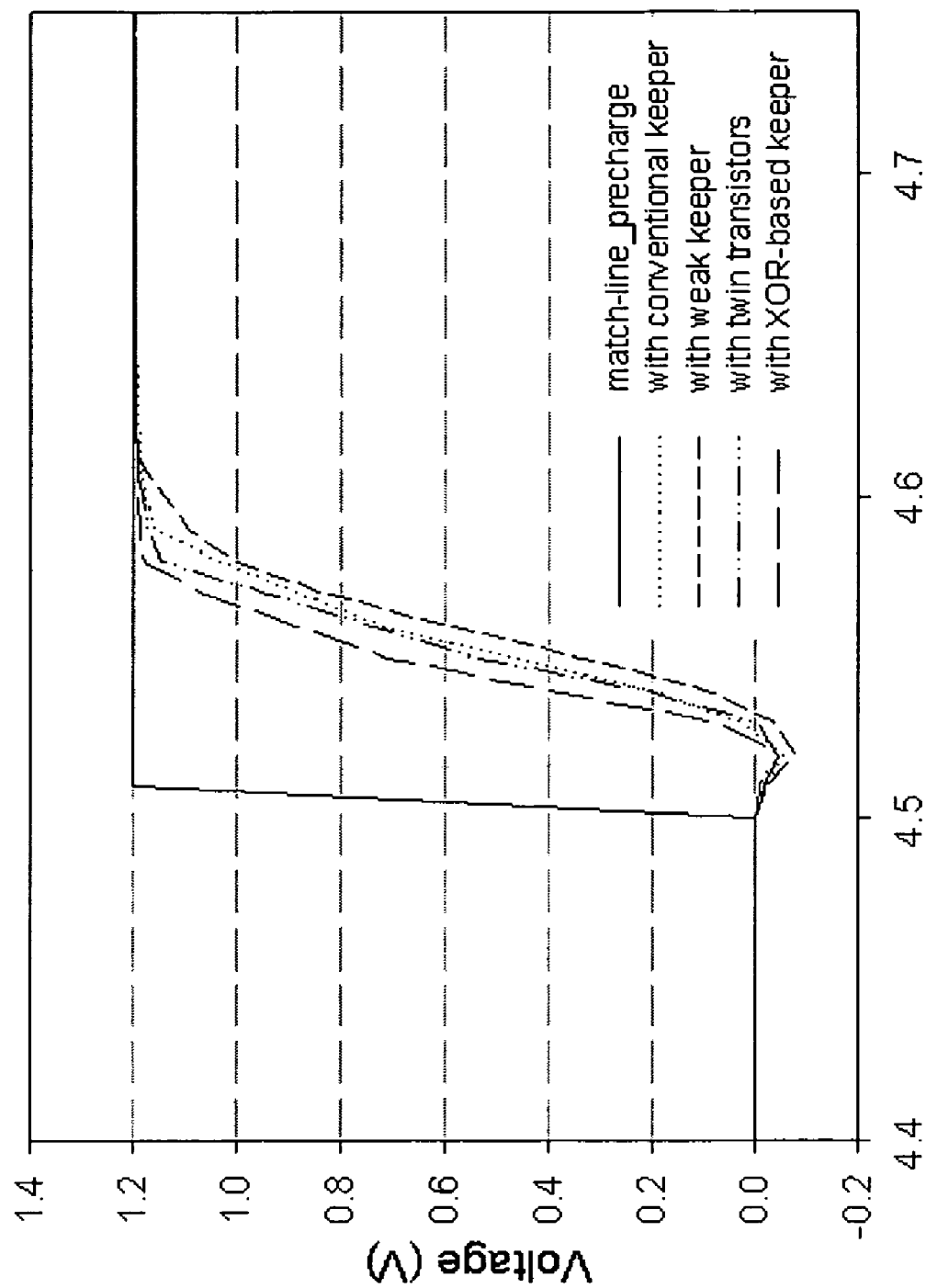
FIG. 13 is a diagram showing the waveform at a given noise intensity (810 mv) of the dynamic AND-type CAM match-line circuit architectures separately using the XOR-based conditional keeper, the feedback keeper, the weak keeper, and the dual NMOS.

However, in contrast to the dynamic NOR-type match-line architecture, the dynamic AND-type match-line architecture does not discharge the floating node to the ground voltage level until the searched data has matched the stored value completely. When 8 bits of data is searched and the searched data matches the stored value, the waveforms at 810 mV of noise intensity of the dynamic AND-type match-line architectures separately having the abovementioned four kinds of keepers are shown in FIG. 13. The XOR-based conditional keeper respectively has 1.8%, 1.0% and 2.5% reduction in the area overhead in comparison with the feedback keeper, the weak keeper and the dual NMOS. The abovementioned comparison is based on size-fixed match-line circuit and upsized keepers and dual NMOS. Via the UNG method, the XOR-based conditional keeper has proved to be superior not only in propagation delay but also in power consumption in the comparison under a given noise intensity.

Figure 14:
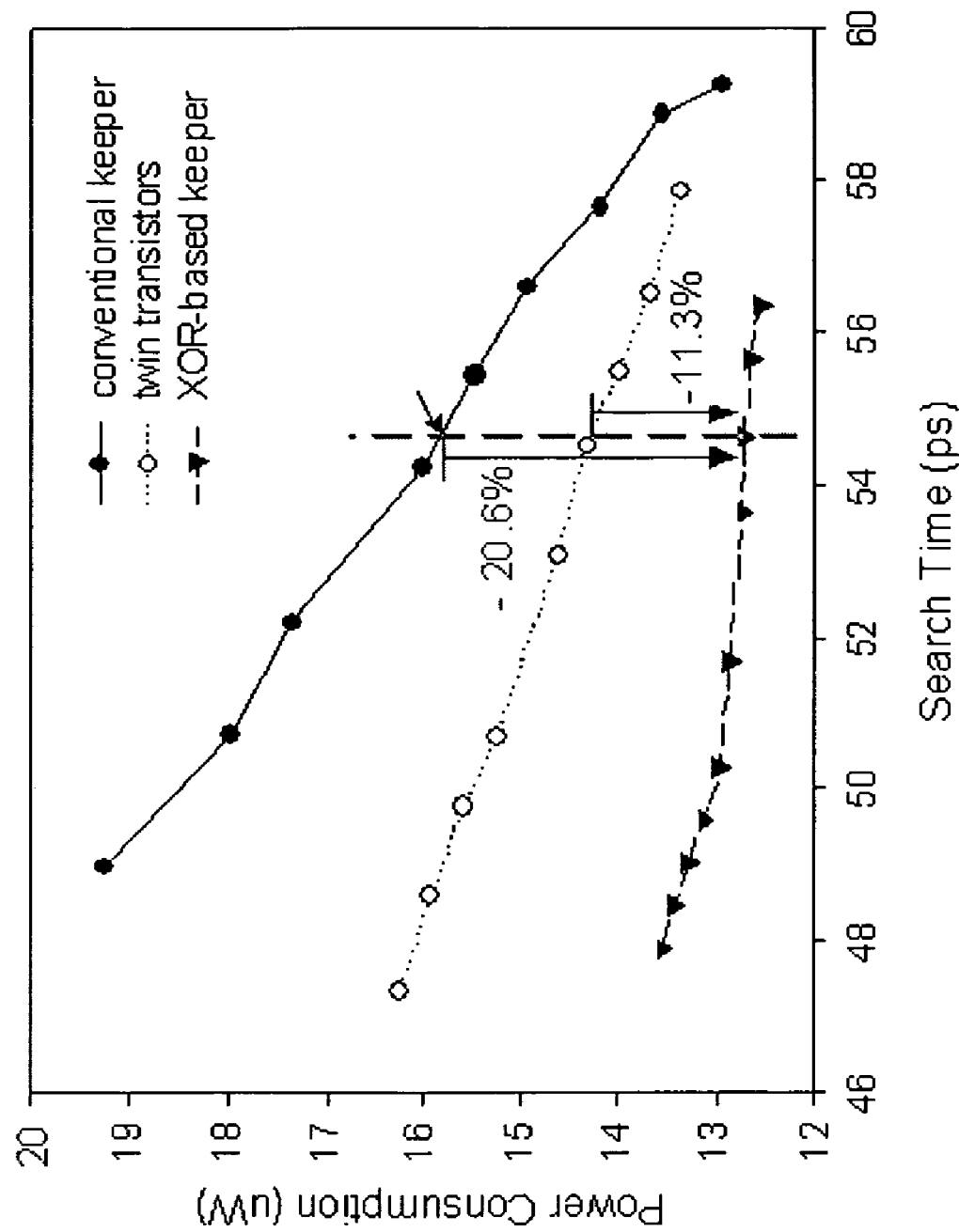
FIG. 14 is a diagram showing the relationship of power consumption versus searching time of the match-line circuit architectures separately using the XOR-based conditional keeper, the feedback keeper, and the dual NMOS.

Next, the power consumption of keepers for a given searching time is to be surveyed below. In general, the match-line circuit is upsized to shorten searching time; therefore, more noise and higher power consumption is regarded as a reasonable cost. Under the condition of size-fixed keepers and dual NMOS, the match-line circuit is upsized, and the relationship of power consumption versus searching time of 8-bit dynamic AND-type match-line architectures is shown in FIG. 14, wherein the 8-bit dynamic AND-type match-line architectures separately have the feedback keeper, the dual NMOS, and the XOR-based conditional keeper. For a given searching time, the XOR-based conditional keeper still has the lowest power consumption; for example, for the searching time of 54.5 picosecond, the XOR-based conditional keeper separately has a 20.6% power saving and a 11.3% power saving in comparison with the conventional feedback keeper and the conventional dual NMOS. Further, at 810 mV of UNG, the dynamic AND-type match-line architecture adopting the XOR-based conditional keeper outperforms that adopting the conventional keeper; at 784 and 786 mV of UNG, the dynamic AND-type match-line architecture adopting the XOR-based conditional keeper outperforms that adopting the dual NMOS.

So far, the description of the characteristics and performance of the XOR-based conditional keeper and the architecture implementing its application to match lines of the present invention has been completed. In conclusion, the present invention has the following advantages: firstly, owing to no need of upsizing the keeper, the XOR-based conditional keeper of the present invention can have a better circuit-design flexibility; secondly, in contrast to only two control modes of "on" and "off" in the conventional keepers, the XOR-based conditional keeper of the present invention can execute different actions according to different statuses of the circuit system, and the present invention can effectively enhance the noise immunity in match-line operation but still has high processing speed and low power consumption; thirdly, when the XOR-based conditional keeper of the present invention is applied to match-line circuit, it can real-time receive the clock signal synchronous with the CAM cell set so that not only propagation delay can be diminished but also power consumption can be effectively reduced; and lastly, as the XOR-based conditional keeper of the present invention has superior noise immunity, it not only can apply to match-line circuit architectures but also can apply to all kinds of dynamic circuits, especially the high fan-in circuits, which are very sensitive to noise.

Below, another embodiment is to be used to demonstrate performance difference between the XOR-based conditional keeper of the present invention and the conventional keeper in Internet packet technology with a CDPD (Cellular Digital Packet Data) system, which is fabricated with 0.13 micron CMOS process of TSMC (Taiwan Semiconductor Manufacturing Company) and can realize an AND-type match-line PF (Packet Filter).

Figure 15:
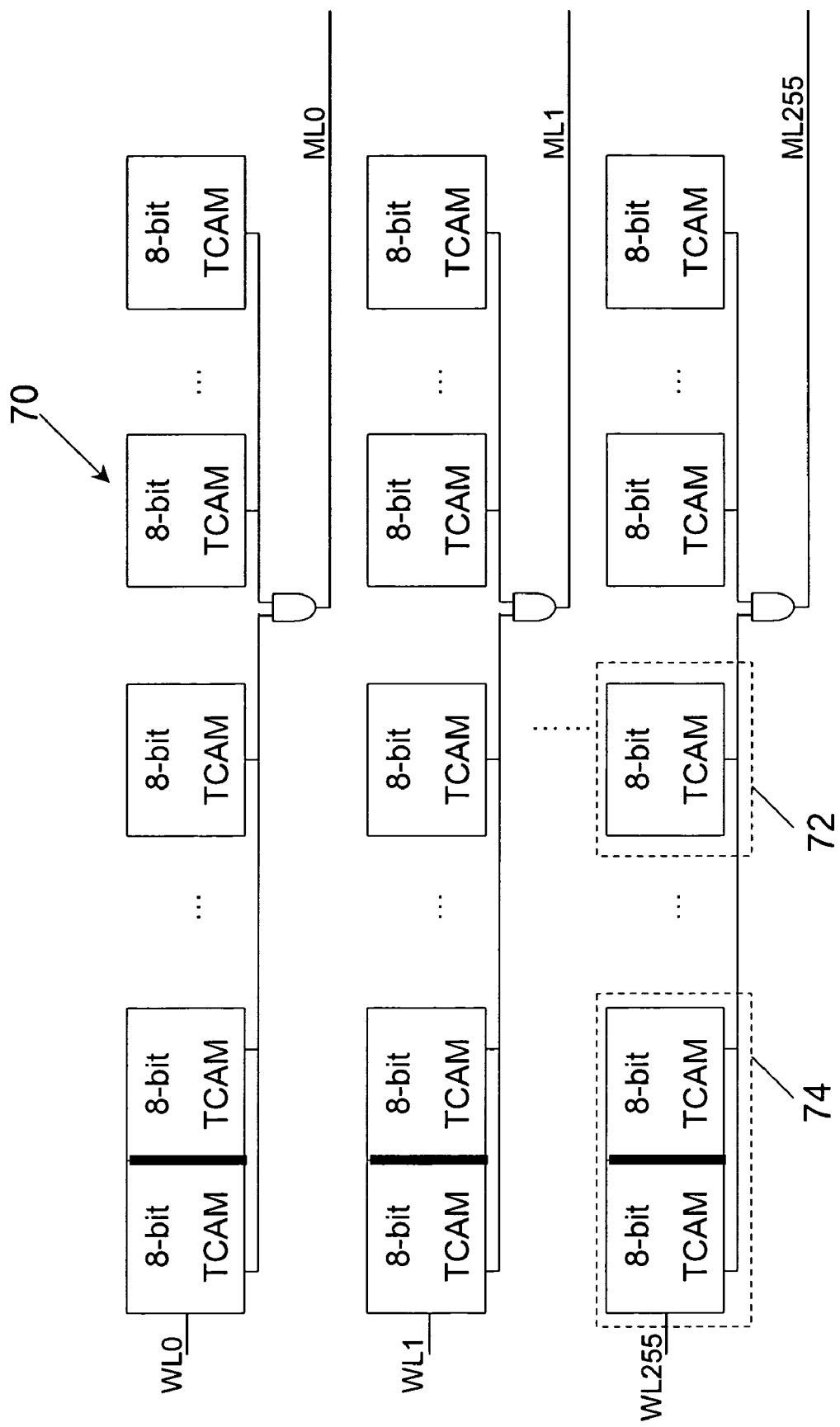
FIG. 15 is a diagram schematically showing the circuit architecture implementing the application of the XOR-based conditional keeper of the present invention to a 256×128-bit TCAM.

As shown in FIG. 15, it is known that a TCAM (ternary CAM) of 256 byte×128 bit can be a combination of two TCAM sub-arrays 72 of 256 byte×64 bit, and different keepers will be applied to a AND-type match-line PF-CDPD system 70 formed of TCAM's. Herein, a first TCAM architecture is formed of repeated 8-stage TCAM sub-array sets 74, and each stage is an 8-bit fan-in circuit, and the first TCAM architecture adopts the XOR-based conditional keeper of the present invention. A second TCAM architecture (not shown in the drawing) comprises PF-CDPD systems, and each match-line therein is formed of 11-stage sub-array sets, wherein the first stage is formed of a 4-bit fan-in circuit, and the other stages are respectively formed of 6-bit fan-in circuits; and all the PF-CDPD circuits therein adopt the conventional keepers. A third TCAM architecture (not shown in the drawing) comprises PF-CDPD circuits, and each match-line therein is formed of 8-stage sub-array sets, wherein each stage is formed of an 8-bit fan-in circuit; and all the PF-CDPD circuits therein adopt the conventional keepers.

Figure 16:
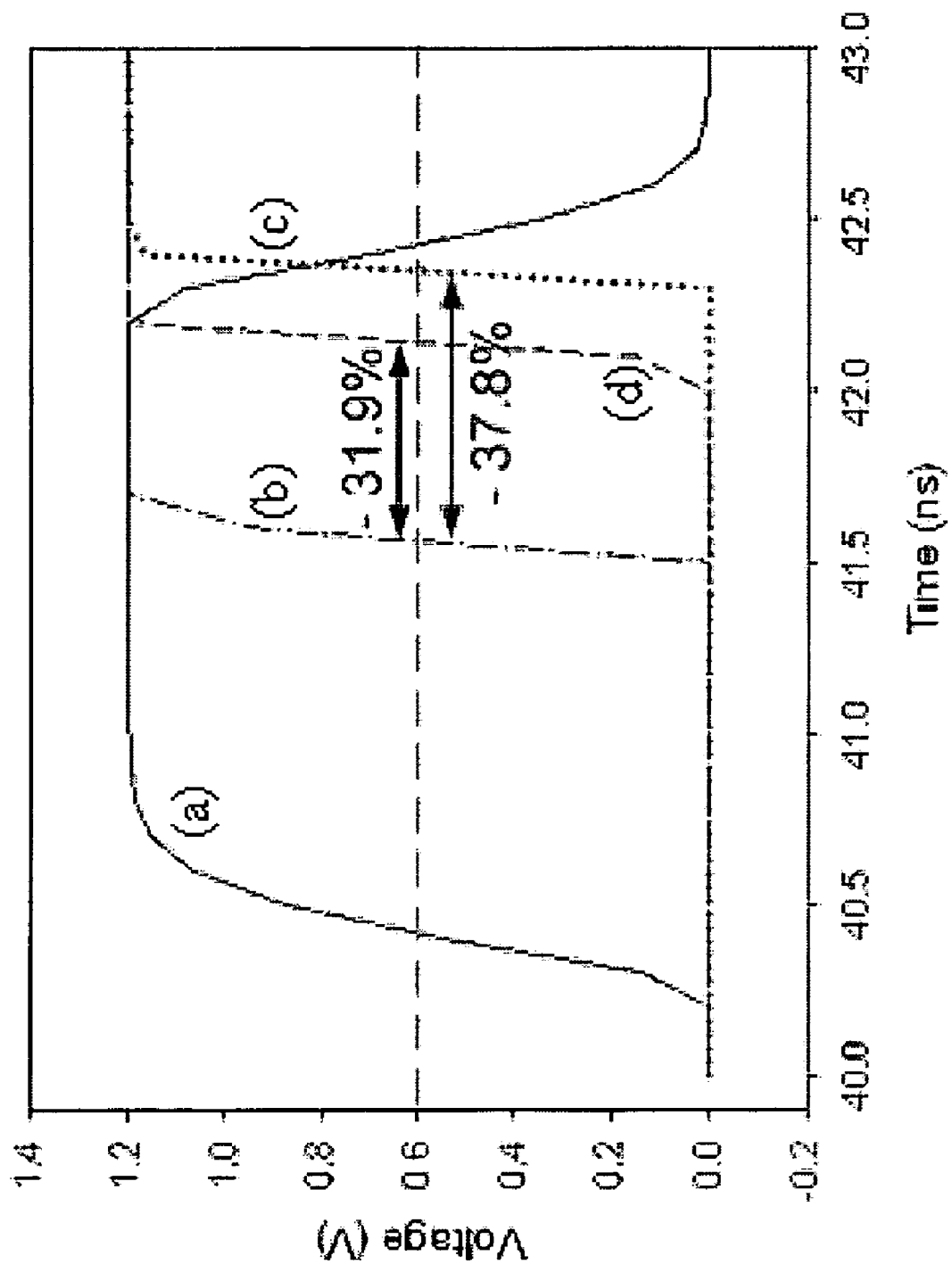
FIG. 16 is a diagram showing the waveform of the circuit architecture implementing the application of the XOR-based conditional keeper of the present invention to a 256×128-bit TCAM.

During the searching process performed by the PF-CDPD circuit systems of the abovementioned three kinds of TCAM's, the searching time and power consumption thereof is compared, and the searching time is defined to be the time from the moment that the pre-charge signal of the match line is High to the moment that the output signal of the match line is High when data matches. Refer to FIG. 16 for the waveforms of the PF-CDPD circuit systems of the abovementioned three kinds of TCAM's, wherein curve (a) represents the pre-charge voltage of the match line; curve (b) represents the voltage of the first system; curve (c) represents the voltage of the second system; and curve (d) represents the voltage of the third system. The first system using the XOR-based conditional keeper has a 37.8% searching time saving in comparison with the second system and has a 31.9% searching time saving in comparison with the third system; for power consumption, the first system separately has a 15.6% power saving and a 18.2% power saving in comparison with the second system and the third system. The reasons why the system using the XOR-based conditional keeper has high processing and low power consumption are: firstly, when the match line enters into the initial period of the evaluation phase, the XOR-based conditional keeper can provide an operational window to turn off the keeper, and thus, the searching time is shortened; secondly, for a given searching time, the comparator circuit size the XOR-based conditional keeper needs is smaller than that the conventional keepers need, and smaller comparator circuit size not only can effectively save space but also can reduce switching capacitance, including match-line capacitance and search-line capacitance; and thirdly, the XOR-based conditional keeper can effectively reduce the charge sharing effect.

Besides, the present invention also provides an architecture to implement the application of the XOR-based conditional keeper to a match line. For a given noise interference, such as at 870 mV of noise intensity, the match line fabricated with a 0.13 micron CMOS process and using the XOR-based conditional keeper can effectively save power and searching time. In the 64-bit NOR-type match-line architecture, the match line using the XOR-based conditional keeper can separately have a 31% energy saving and a 34.5% energy saving in comparison with the upsized conventional feedback keeper and weak keeper, and 1.45% of CAM bits is also saved. In the AND-type match-line architecture, the match line using the XOR-based conditional keeper not only can have 1.0~1.8% energy saving in comparison with the AND-type match-line architectures using the conventional feedback keeper, weak keeper and dual NMOS but also outperforms the AND-type match-line architectures using the other keepers in noise tolerance. Further, for a given searching time, the present invention also has the lowest area cost.

Those above-mentioned embodiments are to clarify the present invention in order to enable the persons skilled in the art to understand, make and use the present invention; however, it is not intended to limit the scope of the present invention; therefore, any equivalent modification and variation according to the present invention is to be included within the scope of the claims of the present invention stated below.

What is claimed is:

1. An XOR-based conditional keeper, electrically coupled to multiple CAM (Content Addressable Memory) cells and at least one transistor switch, and comprising: an XOR gate, electrically coupled to said transistor switch and a floating node, receiving a clock signal synchronous with said CAM cells from said transistor switch, receiving a floating signal from said floating node, and creating an XOR control signal; and a P-type transistor, electrically coupled to said XOR gate, receiving said XOR control signal, and creating a data signal.

2. The XOR-based conditional keeper according to claim 1, wherein the circuit architecture of said XOR gate comprising: a first transistor set, electrically coupled to said transistor switch to receive said clock signal; a second transistor set, electrically coupled to said floating node to transmit said floating signal, and electrically coupled to said first transistor set to transmit said clock signal; and a third transistor set, electrically coupled to said second transistor set to receive said clock signal and said floating signal, and creating said XOR control signal.

3. The XOR-based conditional keeper according to claim 2, wherein said first transistor set, said second transistor set, and said third transistor set are separately formed of a P-type transistor and an N-type transistor.

4. The XOR-based conditional keeper according to claim 1, wherein when said clock signal is Low and said floating signal is Low, said XOR gate outputs said XOR control signal to control said P-type transistor to output said data signal to speed up the pre-charge process.

5. The XOR-based conditional keeper according to claim 1, wherein when said clock signal is Low and said floating signal is High, said XOR gate outputs said XOR control signal to control said P-type transistor to output said data signal to avoid impact at the initial stage of the evaluation phase.

6. The XOR-based conditional keeper according to claim 1, wherein when said clock signal is High and said floating signal is Low, said XOR gate outputs said XOR control signal to control said P-type transistor to output said data signal to turn off said XOR-based conditional keeper.

7. The XOR-based conditional keeper according to claim 1, wherein when said clock signal is High and said floating signal is High, said XOR gate outputs said XOR control signal to control said P-type transistor to output said data signal to enhance noise immunity.

8. The XOR-based conditional keeper according to claim 1, wherein the polarity of said data signal output by said P-type transistor is changed by an inverter, and then, said data signal is output from said inverter.

9. The XOR-based conditional keeper according to claim 1, which can apply to all kinds of dynamic circuits.

10. The XOR-based conditional keeper according to claim 1, which can apply to a high fan-in circuit.

11. An XOR-based conditional keeper and an architecture implementing its application to match lines, comprising: multiple CAM (Content Addressable Memory) cells, each formed of a CAM and an N-type transistor, and electrically interconnected in series to create a synchronous clock signal; at least one transistor switch, electrically coupled to said CAM cells to transmit said clock signal; and an XOR-based conditional keeper, electrically coupled to said CAM cells and said transistor switch, and further comprising: an XOR gate, receiving said clock signal, electrically coupled to a floating node to receive a floating signal, and creating an XOR control signal; and a P-type transistor, receiving said XOR control signal, and creating a data signal.

12. The XOR-based conditional keeper and the architecture implementing its application to match lines according to claim 11, wherein said CAM is a NOR-type one.

13. The XOR-based conditional keeper and the architecture implementing its application to match lines according to claim 11, wherein said CAM is an AND-type one.

14. The XOR-based conditional keeper and the architecture implementing its application to match lines according to claim 11, wherein the circuit architecture of said XOR gate comprising: a first transistor set, electrically coupled to said transistor switch to receive said clock signal; a second transistor set, electrically coupled to said floating node to transmit said floating signal, and electrically coupled to said first transistor set to transmit said clock signal; and a third transistor set, electrically coupled to said second transistor set to receive said clock signal and said floating signal, and creating said XOR control signal.

15. The XOR-based conditional keeper and the architecture implementing its application to match lines according to claim 14, wherein said first transistor set, said second transistor set, and said third transistor set are separately formed of a P-type transistor and an N-type transistor.

16. The XOR-based conditional keeper and the architecture implementing its application to match lines according to claim 11, wherein when said clock signal is Low and said floating signal is Low, said XOR gate outputs said XOR control signal to control said P-type transistor to output said data signal to speed up the pre-charge process.

17. The XOR-based conditional keeper and the architecture implementing its application to match lines according to claim 11, wherein when said clock signal is Low and said floating signal is High, said XOR gate outputs said XOR control signal to control said P-type transistor to output said data signal to avoid impact at the initial stage of the evaluation phase.

18. The XOR-based conditional keeper and the architecture implementing its application to match lines according to claim 11, wherein when said clock signal is High and said floating signal is Low, said XOR gate outputs said XOR control signal to control said P-type transistor to output said data signal to turn off said XOR-based conditional keeper.

19. The XOR-based conditional keeper and the architecture implementing its application to match lines according to claim 11, wherein when said clock signal is High and said floating signal is High, said XOR gate outputs said XOR control signal to control said P-type transistor to output said data signal to enhance noise immunity.

20. The XOR-based conditional keeper and the architecture implementing its application to match lines according to claim 11, wherein the polarity of said data signal output by said P-type transistor is changed by an inverter, and then, said data signal is output from said inverter.

* * * * *